United States Patent
Kanamarlapudi

(10) Patent No.: US 11,805,439 B2
(45) Date of Patent: Oct. 31, 2023

(54) TECHNIQUES FOR OPTIMIZED TRAFFIC VOLUME REPORTING

(71) Applicant: QUALCOMM Incorporated, San Diego, CA (US)

(72) Inventor: Sitaramanjaneyulu Kanamarlapudi, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 168 days.

(21) Appl. No.: 17/444,110

(22) Filed: Jul. 30, 2021

(65) Prior Publication Data
US 2022/0070103 A1    Mar. 3, 2022

Related U.S. Application Data

(60) Provisional application No. 62/706,565, filed on Aug. 25, 2020.

(51) Int. Cl.
| | |
|---|---|
| *H04L 43/16* | (2022.01) |
| *H04L 47/30* | (2022.01) |
| *H04W 24/10* | (2009.01) |
| *H04W 28/02* | (2009.01) |
| *H04W 28/06* | (2009.01) |
| *H04W 72/00* | (2023.01) |

(Continued)

(52) U.S. Cl.
CPC ......... *H04W 28/0278* (2013.01); *H04L 43/16* (2013.01); *H04L 47/30* (2013.01); *H04W 24/10* (2013.01); *H04W 28/06* (2013.01); *H04W 72/231* (2023.01); *H04W 72/52* (2023.01); *H04W 76/27* (2018.02); *H04W 84/02* (2013.01); *H04W 88/02* (2013.01); *H04W 88/08* (2013.01); *H04W 92/02* (2013.01); *H04W 92/10* (2013.01)

(58) Field of Classification Search
CPC ........ H04L 43/02–55; H04L 47/10–83; H03M 7/30–707; H04W 8/18–245; H04W 24/02–10; H04W 28/02–26; H04W 48/02–20; H04W 72/02–569; H04W 74/002–008; H04W 76/10–50; H04W 80/02–12; H04W 84/005–22; H04W 88/005–188; H04W 92/02–24
See application file for complete search history.

(56) References Cited

U.S. PATENT DOCUMENTS

| | | | |
|---|---|---|---|
| 2008/0084851 A1* | 4/2008 | Kim | H04W 28/0278 |
| 2009/0052420 A1* | 2/2009 | Fischer | H04W 28/0278 |

(Continued)

OTHER PUBLICATIONS

International Search Report and Written Opinion—PCT/US2021/071083—ISA/EPO—dated Dec. 8, 2021.

(Continued)

*Primary Examiner* — Timothy J Weidner
(74) *Attorney, Agent, or Firm* — Dalei Dong; Harrity & Harrity, LLP

(57) ABSTRACT

Various aspects of the present disclosure generally relate to wireless communication. In some aspects, a user equipment (UE) may compress data, of an uncompressed size, associated with an uplink transmission to a compressed size. The UE may transmit a message based at least in part on the uncompressed size of the data associated with the uplink transmission satisfying a threshold. The UE may transmit the compressed data in the compressed size. Numerous other aspects are provided.

30 Claims, 7 Drawing Sheets

(51) Int. Cl.
*H04W 76/27* (2018.01)
*H04W 84/02* (2009.01)
*H04W 88/02* (2009.01)
*H04W 88/08* (2009.01)
*H04W 92/02* (2009.01)
*H04W 92/10* (2009.01)
*H04W 72/231* (2023.01)
*H04W 72/52* (2023.01)

(56) References Cited

U.S. PATENT DOCUMENTS

2015/0249610 A1* 9/2015 Kanamarlapudi .... H04W 28/06
2022/0377602 A1* 11/2022 Kim ..................... H04W 28/06

OTHER PUBLICATIONS

LG Electronics Inc: "TVM for Compressed Data," 3GPP Draft, 3GPP TSG RAN WG2 #60bis, R2-080340 TVM for Compressed Data V2, 3rd Generation Partnership Project (3GPP), Mobile Competence Centre, 650, Route Des Lucioles, F-06921, Sophia-Antipolis Cedex, France, vol. RAN WG2. No. Sevilla. Spain, Jan. 14, 2008-Jan. 18, 2008, Jan. 8, 2008 (Jan. 8, 2008), XP050138197, 2 pages, [retrieved on Jan. 8, 2008] section Values to be reported section impact on MAC and traffic measurement.

* cited by examiner

TECHNIQUES FOR OPTIMIZED TRAFFIC VOLUME REPORTING

CROSS-REFERENCE TO RELATED APPLICATION

This Patent Application claims priority to U.S. Provisional Patent Application No. 62/706,565, filed on Aug. 25, 2020, entitled "TECHNIQUES FOR OPTIMIZED TRAFFIC VOLUME MEASUREMENT REPORTING," and assigned to the assignee hereof. The disclosure of the prior Application is considered part of and is incorporated by reference into this patent Application.

FIELD OF THE DISCLOSURE

Aspects of the present disclosure generally relate to wireless communication and to techniques and apparatuses for optimized traffic volume reporting.

DESCRIPTION OF RELATED ART

Wireless communication systems are widely deployed to provide various telecommunication services such as telephony, video, data, messaging, and broadcasts. Typical wireless communication systems may employ multiple-access technologies capable of supporting communication with multiple users by sharing available system resources (e.g., bandwidth, transmit power, or the like). Examples of such multiple-access technologies include code division multiple access (CDMA) systems, time division multiple access (TDMA) systems, frequency-division multiple access (FDMA) systems, orthogonal frequency-division multiple access (OFDMA) systems, single-carrier frequency-division multiple access (SC-FDMA) systems, time division synchronous code division multiple access (TD-SCDMA) systems, and Long Term Evolution (LTE). LTE/LTE-Advanced is a set of enhancements to the Universal Mobile Telecommunications System (UMTS) mobile standard promulgated by the Third Generation Partnership Project (3GPP).

A wireless network may include a number of base stations (BSs) that can support communication for a number of user equipment (UEs). A UE may communicate with a BS via the downlink and uplink. The downlink (or forward link) refers to the communication link from the BS to the UE, and the uplink (or reverse link) refers to the communication link from the UE to the BS. As will be described in more detail herein, a BS may be referred to as a Node B, a gNB, an access point (AP), a radio head, a transmit receive point (TRP), a New Radio (NR) BS, a 5G Node B, or the like.

The above multiple access technologies have been adopted in various telecommunication standards to provide a common protocol that enables different user equipment to communicate on a municipal, national, regional, and even global level. NR, which may also be referred to as 5G, is a set of enhancements to the LTE mobile standard promulgated by the 3GPP. NR is designed to better support mobile broadband Internet access by improving spectral efficiency, lowering costs, improving services, making use of new spectrum, and better integrating with other open standards using orthogonal frequency division multiplexing (OFDM) with a cyclic prefix (CP) (CP-OFDM) on the downlink (DL), using CP-OFDM and/or SC-FDM (e.g., also known as discrete Fourier transform spread OFDM (DFT-s-OFDM)) on the uplink (UL), as well as supporting beamforming, multiple-input multiple-output (MIMO) antenna technology, and carrier aggregation. As the demand for mobile broadband access continues to increase, further improvements in LTE, NR, and other radio access technologies remain useful.

SUMMARY

In some aspects, a method of wireless communication performed by a user equipment (UE) includes compressing data, of an uncompressed size, associated with an uplink transmission to a compressed size; transmitting a message based at least in part on the uncompressed size of the data associated with the uplink transmission satisfying a threshold; and transmitting the compressed data in the compressed size.

In some aspects, a UE for wireless communication includes a memory and one or more processors, coupled to the memory, configured to: compress data, of an uncompressed size, associated with an uplink transmission to a compressed size; transmit a message based at least in part on the uncompressed size of the data associated with the uplink transmission satisfying a threshold; and transmit the compressed data in the compressed size.

In some aspects, a non-transitory computer-readable medium storing a set of instructions for wireless communication includes one or more instructions that, when executed by one or more processors of a UE, cause the UE to: compress data, of an uncompressed size, associated with an uplink transmission to a compressed size; transmit a message based at least in part on the uncompressed size of the data associated with the uplink transmission satisfying a threshold; and transmit the compressed data in the compressed size.

In some aspects, an apparatus for wireless communication includes means for compressing data, of an uncompressed size, associated with an uplink transmission to a compressed size; means for transmitting a message based at least in part on the uncompressed size of the data associated with the uplink transmission satisfying a threshold; and means for transmitting the compressed data in the compressed size.

Aspects generally include a method, apparatus, system, computer program product, non-transitory computer-readable medium, user equipment, base station, wireless communication device, and/or processing system as substantially described herein with reference to and as illustrated by the drawings and specification.

The foregoing has outlined rather broadly the features and technical advantages of examples according to the disclosure in order that the detailed description that follows may be better understood. Additional features and advantages will be described hereinafter. The conception and specific examples disclosed may be readily utilized as a basis for modifying or designing other structures for carrying out the same purposes of the present disclosure. Such equivalent constructions do not depart from the scope of the appended claims. Characteristics of the concepts disclosed herein, both their organization and method of operation, together with associated advantages will be better understood from the following description when considered in connection with the accompanying figures. Each of the figures is provided for the purposes of illustration and description, and not as a definition of the limits of the claims.

BRIEF DESCRIPTION OF THE DRAWINGS

So that the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects. The same reference numbers in different drawings may identify the same or similar elements.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

Several aspects of telecommunication systems will now be presented with reference to various apparatuses and techniques. These apparatuses and techniques will be described in the following detailed description and illustrated in the accompanying drawings by various blocks, modules, components, circuits, steps, processes, algorithms, or the like (collectively referred to as "elements"). These elements may be implemented using hardware, software, or combinations thereof. Whether such elements are implemented as hardware or software depends upon the particular application and design constraints imposed on the overall system.

It should be noted that while aspects may be described herein using terminology commonly associated with a 5G or NR radio access technology (RAT), aspects of the present disclosure can be applied to other RATs, such as a 3G RAT, a 4G RAT, and/or a RAT subsequent to 5G (e.g., 6G).

Figure 1:
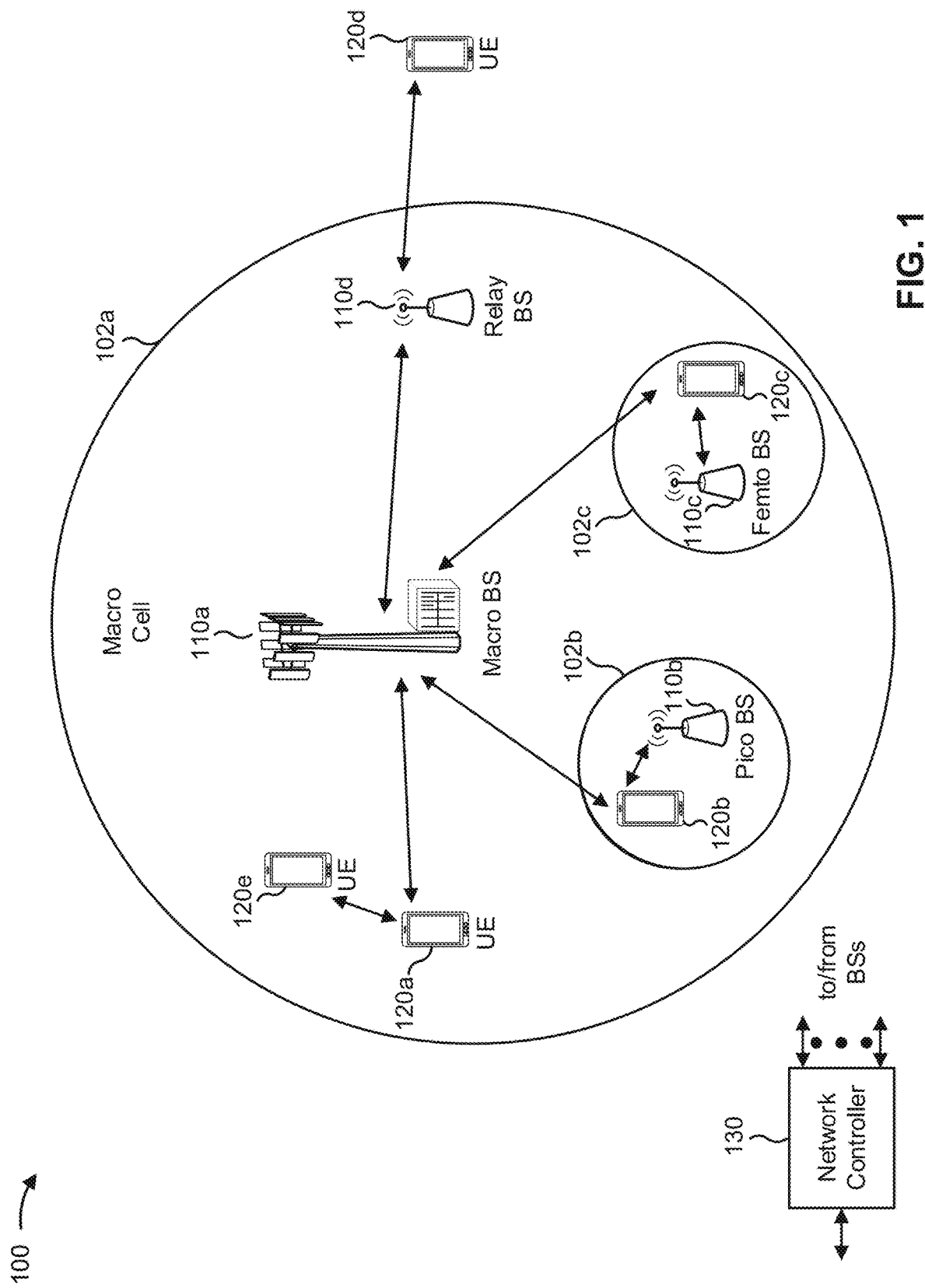
FIG. 1 is a diagram illustrating an example of a wireless network, in accordance with the present disclosure.

FIG. 1 is a diagram illustrating an example of a wireless network 100, in accordance with the present disclosure. The wireless network 100 may be or may include elements of a 5G (NR) network and/or an LTE network, among other examples. The wireless network 100 may include a number of base stations 110 (shown as BS 110a, BS 110b, BS 110c, and BS 110d) and other network entities. A base station (BS) is an entity that communicates with user equipment (UEs) and may also be referred to as an NR BS, a Node B, a gNB, a 5G node B (NB), an access point, a transmit receive point (TRP), or the like. Each BS may provide communication coverage for a particular geographic area. In 3GPP, the term "cell" can refer to a coverage area of a BS and/or a BS subsystem serving this coverage area, depending on the context in which the term is used.

A BS may provide communication coverage for a macro cell, a pico cell, a femto cell, and/or another type of cell. A macro cell may cover a relatively large geographic area (e.g., several kilometers in radius) and may allow unrestricted access by UEs with service subscription. A pico cell may cover a relatively small geographic area and may allow unrestricted access by UEs with service subscription. A femto cell may cover a relatively small geographic area (e.g., a home) and may allow restricted access by UEs having association with the femto cell (e.g., UEs in a closed subscriber group (CSG)). ABS for a macro cell may be referred to as a macro BS. ABS for a pico cell may be referred to as a pico BS. A BS for a femto cell may be referred to as a femto BS or a home BS. In the example shown in FIG. 1, a BS 110a may be a macro BS for a macro cell 102a, a BS 110b may be a pico BS for a pico cell 102b, and a BS 110c may be a femto BS for a femto cell 102c. A BS may support one or multiple (e.g., three) cells. The terms "eNB", "base station", "NR BS", "gNB", "TRP", "AP", "node B", "5G NB", and "cell" may be used interchangeably herein.

In some aspects, a cell may not necessarily be stationary, and the geographic area of the cell may move according to the location of a mobile BS. In some aspects, the BSs may be interconnected to one another and/or to one or more other BSs or network nodes (not shown) in the wireless network 100 through various types of backhaul interfaces, such as a direct physical connection or a virtual network, using any suitable transport network.

Wireless network 100 may also include relay stations. A relay station is an entity that can receive a transmission of data from an upstream station (e.g., a BS or a UE) and send a transmission of the data to a downstream station (e.g., a UE or a BS). A relay station may also be a UE that can relay transmissions for other UEs. In the example shown in FIG. 1, a relay BS 110d may communicate with macro BS 110a and a UE 120d in order to facilitate communication between BS 110a and UE 120d. A relay BS may also be referred to as a relay station, a relay base station, a relay, or the like.

Wireless network 100 may be a heterogeneous network that includes BSs of different types, such as macro BSs, pico BSs, femto BSs, relay BSs, or the like. These different types of BSs may have different transmit power levels, different coverage areas, and different impacts on interference in wireless network 100. For example, macro BSs may have a high transmit power level (e.g., 5 to 40 watts) whereas pico BSs, femto BSs, and relay BSs may have lower transmit power levels (e.g., 0.1 to 2 watts).

A network controller 130 may couple to a set of BSs and may provide coordination and control for these BSs. Network controller 130 may communicate with the BSs via a backhaul. The BSs may also communicate with one another, e.g., directly or indirectly via a wireless or wireline backhaul.

UEs 120 (e.g., 120*a*, 120*b*, 120*c*) may be dispersed throughout wireless network 100, and each UE may be stationary or mobile. A UE may also be referred to as an access terminal, a terminal, a mobile station, a subscriber unit, a station, or the like. A UE may be a cellular phone (e.g., a smart phone), a personal digital assistant (PDA), a wireless modem, a wireless communication device, a handheld device, a laptop computer, a cordless phone, a wireless local loop (WLL) station, a tablet, a camera, a gaming device, a netbook, a smartbook, an ultrabook, a medical device or equipment, biometric sensors/devices, wearable devices (smart watches, smart clothing, smart glasses, smart wrist bands, smart jewelry (e.g., smart ring, smart bracelet)), an entertainment device (e.g., a music or video device, or a satellite radio), a vehicular component or sensor, smart meters/sensors, industrial manufacturing equipment, a global positioning system device, or any other suitable device that is configured to communicate via a wireless or wired medium.

Some UEs may be considered machine-type communication (MTC) or evolved or enhanced machine-type communication (eMTC) UEs. MTC and eMTC UEs include, for example, robots, drones, remote devices, sensors, meters, monitors, and/or location tags, that may communicate with a base station, another device (e.g., remote device), or some other entity. A wireless node may provide, for example, connectivity for or to a network (e.g., a wide area network such as Internet or a cellular network) via a wired or wireless communication link. Some UEs may be considered Internet-of-Things (IoT) devices, and/or may be implemented as NB-IoT (narrowband internet of things) devices. Some UEs may be considered a Customer Premises Equipment (CPE). UE 120 may be included inside a housing that houses components of UE 120, such as processor components and/or memory components. In some aspects, the processor components and the memory components may be coupled together. For example, the processor components (e.g., one or more processors) and the memory components (e.g., a memory) may be operatively coupled, communicatively coupled, electronically coupled, and/or electrically coupled.

In general, any number of wireless networks may be deployed in a given geographic area. Each wireless network may support a particular RAT and may operate on one or more frequencies. A RAT may also be referred to as a radio technology, an air interface, or the like. A frequency may also be referred to as a carrier, a frequency channel, or the like. Each frequency may support a single RAT in a given geographic area in order to avoid interference between wireless networks of different RATs. In some cases, NR or 5G RAT networks may be deployed.

In some aspects, two or more UEs 120 (e.g., shown as UE 120*a* and UE 120*e*) may communicate directly using one or more sidelink channels (e.g., without using a base station 110 as an intermediary to communicate with one another). For example, the UEs 120 may communicate using peer-to-peer (P2P) communications, device-to-device (D2D) communications, a vehicle-to-everything (V2X) protocol (e.g., which may include a vehicle-to-vehicle (V2V) protocol or a vehicle-to-infrastructure (V2I) protocol), and/or a mesh network. In this case, the UE 120 may perform scheduling operations, resource selection operations, and/or other operations described elsewhere herein as being performed by the base station 110.

Devices of wireless network 100 may communicate using the electromagnetic spectrum, which may be subdivided based on frequency or wavelength into various classes, bands, channels, or the like. For example, devices of wireless network 100 may communicate using an operating band having a first frequency range (FR1), which may span from 410 MHz to 7.125 GHz, and/or may communicate using an operating band having a second frequency range (FR2), which may span from 24.25 GHz to 52.6 GHz. The frequencies between FR1 and FR2 are sometimes referred to as mid-band frequencies. Although a portion of FR1 is greater than 6 GHz, FR1 is often referred to as a "sub-6 GHz" band. Similarly, FR2 is often referred to as a "millimeter wave" band despite being different from the extremely high frequency (EHF) band (30 GHz-300 GHz) which is identified by the International Telecommunications Union (ITU) as a "millimeter wave" band. Thus, unless specifically stated otherwise, it should be understood that the term "sub-6 GHz" or the like, if used herein, may broadly represent frequencies less than 6 GHz, frequencies within FR1, and/or mid-band frequencies (e.g., greater than 7.125 GHz). Similarly, unless specifically stated otherwise, it should be understood that the term "millimeter wave" or the like, if used herein, may broadly represent frequencies within the EHF band, frequencies within FR2, and/or mid-band frequencies (e.g., less than 24.25 GHz). It is contemplated that the frequencies included in FR1 and FR2 may be modified, and techniques described herein are applicable to those modified frequency ranges.

As indicated above, FIG. 1 is provided as an example. Other examples may differ from what is described with regard to FIG. 1.

Figure 2:
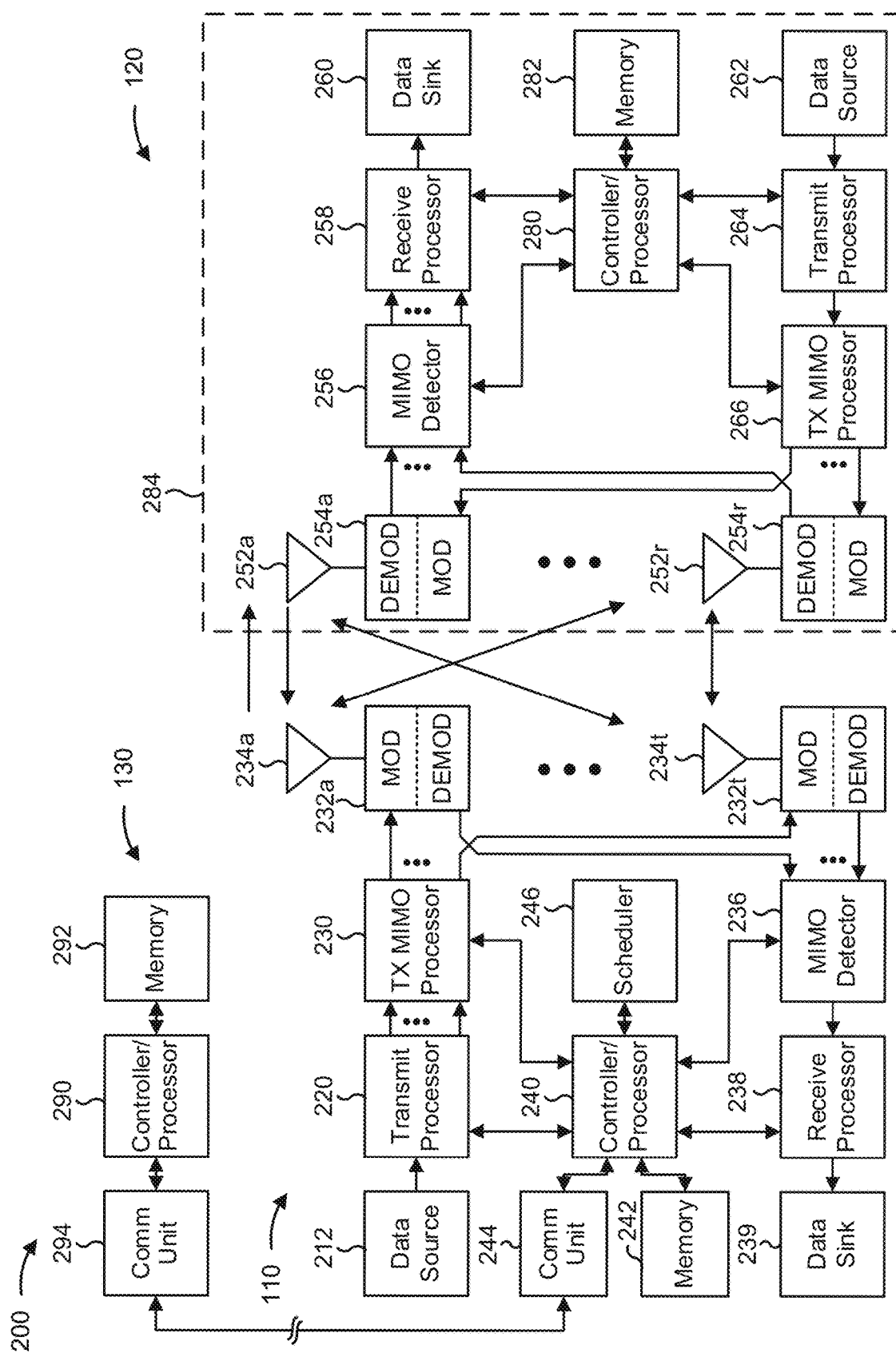
FIG. 2 is a diagram illustrating an example of a base station in communication with a user equipment (UE) in a wireless network, in accordance with the present disclosure.

FIG. 2 is a diagram illustrating an example 200 of a base station 110 in communication with a UE 120 in a wireless network 100, in accordance with the present disclosure. Base station 110 may be equipped with T antennas 234*a* through 234*t*, and UE 120 may be equipped with R antennas 252*a* through 252*r*, where in general T≥1 and R≥1.

At base station 110, a transmit processor 220 may receive data from a data source 212 for one or more UEs, select one or more modulation and coding schemes (MCS) for each UE based at least in part on channel quality indicators (CQIs) received from the UE, process (e.g., encode and modulate) the data for each UE based at least in part on the MCS(s) selected for the UE, and provide data symbols for all UEs. Transmit processor 220 may also process system information (e.g., for semi-static resource partitioning information (SRPI)) and control information (e.g., CQI requests, grants, and/or upper layer signaling) and provide overhead symbols and control symbols. Transmit processor 220 may also generate reference symbols for reference signals (e.g., a cell-specific reference signal (CRS) or a demodulation reference signal (DMRS)) and synchronization signals (e.g., a primary synchronization signal (PSS) or a secondary synchronization signal (SSS)). A transmit (TX) multiple-input multiple-output (MIMO) processor 230 may perform spatial processing (e.g., precoding) on the data symbols, the control symbols, the overhead symbols, and/or the reference symbols, if applicable, and may provide T output symbol streams to T modulators (MODs) 232*a* through 232*t*. Each modulator 232 may process a respective output symbol stream (e.g., for OFDM) to obtain an output sample stream. Each modulator 232 may further process (e.g., convert to analog, amplify, filter, and upconvert) the output sample stream to obtain a downlink signal. T downlink signals from modulators 232*a* through 232*t* may be transmitted via T antennas 234*a* through 234*t*, respectively.

At UE 120, antennas 252*a* through 252*r* may receive the downlink signals from base station 110 and/or other base stations and may provide received signals to demodulators (DEMODs) 254*a* through 254*r*, respectively. Each demodulator 254 may condition (e.g., filter, amplify, downconvert, and digitize) a received signal to obtain input samples. Each demodulator 254 may further process the input samples (e.g., for OFDM) to obtain received symbols. A MIMO detector 256 may obtain received symbols from all R demodulators 254a through 254r, perform MIMO detection on the received symbols if applicable, and provide detected symbols. A receive processor 258 may process (e.g., demodulate and decode) the detected symbols, provide decoded data for UE 120 to a data sink 260, and provide decoded control information and system information to a controller/processor 280. The term "controller/processor" may refer to one or more controllers, one or more processors, or a combination thereof. A channel processor may determine a reference signal received power (RSRP) parameter, a received signal strength indicator (RSSI) parameter, a reference signal received quality (RSRQ) parameter, an/or a CQI parameter, among other examples. In some aspects, one or more components of UE 120 may be included in a housing 284.

Network controller 130 may include communication unit 294, controller/processor 290, and memory 292. Network controller 130 may include, for example, one or more devices in a core network. Network controller 130 may communicate with base station 110 via communication unit 294.

Antennas (e.g., antennas 234a through 234t and/or antennas 252a through 252r) may include, or may be included within, one or more antenna panels, antenna groups, sets of antenna elements, and/or antenna arrays, among other examples. An antenna panel, an antenna group, a set of antenna elements, and/or an antenna array may include one or more antenna elements. An antenna panel, an antenna group, a set of antenna elements, and/or an antenna array may include a set of coplanar antenna elements and/or a set of non-coplanar antenna elements. An antenna panel, an antenna group, a set of antenna elements, and/or an antenna array may include antenna elements within a single housing and/or antenna elements within multiple housings. An antenna panel, an antenna group, a set of antenna elements, and/or an antenna array may include one or more antenna elements coupled to one or more transmission and/or reception components, such as one or more components of FIG. 2.

On the uplink, at UE 120, a transmit processor 264 may receive and process data from a data source 262 and control information (e.g., for reports that include RSRP, RSSI, RSRQ, and/or CQI) from controller/processor 280. Transmit processor 264 may also generate reference symbols for one or more reference signals. The symbols from transmit processor 264 may be precoded by a TX MIMO processor 266 if applicable, further processed by modulators 254a through 254r (e.g., for DFT-s-OFDM or CP-OFDM), and transmitted to base station 110. In some aspects, a modulator and a demodulator (e.g., MOD/DEMOD 254) of the UE 120 may be included in a modem of the UE 120. In some aspects, the UE 120 includes a transceiver. The transceiver may include any combination of antenna(s) 252, modulators and/or demodulators 254, MIMO detector 256, receive processor 258, transmit processor 264, and/or TX MIMO processor 266. The transceiver may be used by a processor (e.g., controller/processor 280) and memory 282 to perform aspects of any of the methods described herein.

At base station 110, the uplink signals from UE 120 and other UEs may be received by antennas 234, processed by demodulators 232, detected by a MIMO detector 236 if applicable, and further processed by a receive processor 238 to obtain decoded data and control information sent by UE 120. Receive processor 238 may provide the decoded data to a data sink 239 and the decoded control information to controller/processor 240. Base station 110 may include communication unit 244 and communicate to network controller 130 via communication unit 244. Base station 110 may include a scheduler 246 to schedule UEs 120 for downlink and/or uplink communications. In some aspects, a modulator and a demodulator (e.g., MOD/DEMOD 232) of the base station 110 may be included in a modem of the base station 110. In some aspects, the base station 110 includes a transceiver. The transceiver may include any combination of antenna(s) 234, modulators and/or demodulators 232, MIMO detector 236, receive processor 238, transmit processor 220, and/or TX MIMO processor 230. The transceiver may be used by a processor (e.g., controller/processor 240) and memory 242 to perform aspects of any of the methods described herein.

Controller/processor 240 of base station 110, controller/processor 280 of UE 120, and/or any other component(s) of FIG. 2 may perform one or more techniques associated with optimized traffic volume reporting, as described in more detail elsewhere herein. For example, controller/processor 240 of base station 110, controller/processor 280 of UE 120, and/or any other component(s) of FIG. 2 may perform or direct operations of, for example, process 500 of FIG. 5 and/or other processes as described herein. Memories 242 and 282 may store data and program codes for base station 110 and UE 120, respectively. In some aspects, memory 242 and/or memory 282 may include a non-transitory computer-readable medium storing one or more instructions (e.g., code and/or program code) for wireless communication. For example, the one or more instructions, when executed (e.g., directly, or after compiling, converting, and/or interpreting) by one or more processors of the base station 110 and/or the UE 120, may cause the one or more processors, the UE 120, and/or the base station 110 to perform or direct operations of, for example, process 500 of FIG. 5 and/or other processes as described herein. In some aspects, executing instructions may include running the instructions, converting the instructions, compiling the instructions, and/or interpreting the instructions.

In some aspects, UE 120 may include means for compressing data, of an uncompressed size, associated with an uplink transmission to a compressed size, means for determining that the uncompressed size of the data associated with the uplink transmission satisfies a threshold, means for transmitting a message based at least in part on the uncompressed size of the data associated with the uplink transmission satisfying the threshold, means for transmitting the compressed data in the compressed size, and/or the like. In some aspects, such means may include one or more components of UE 120 described in connection with FIG. 2, such as controller/processor 280, transmit processor 264, TX MIMO processor 266, MOD 254, antenna 252, DEMOD 254, MIMO detector 256, receive processor 258, and/or the like.

As indicated above, FIG. 2 is provided as an example. Other examples may differ from what is described with regard to FIG. 2.

Figure 3:
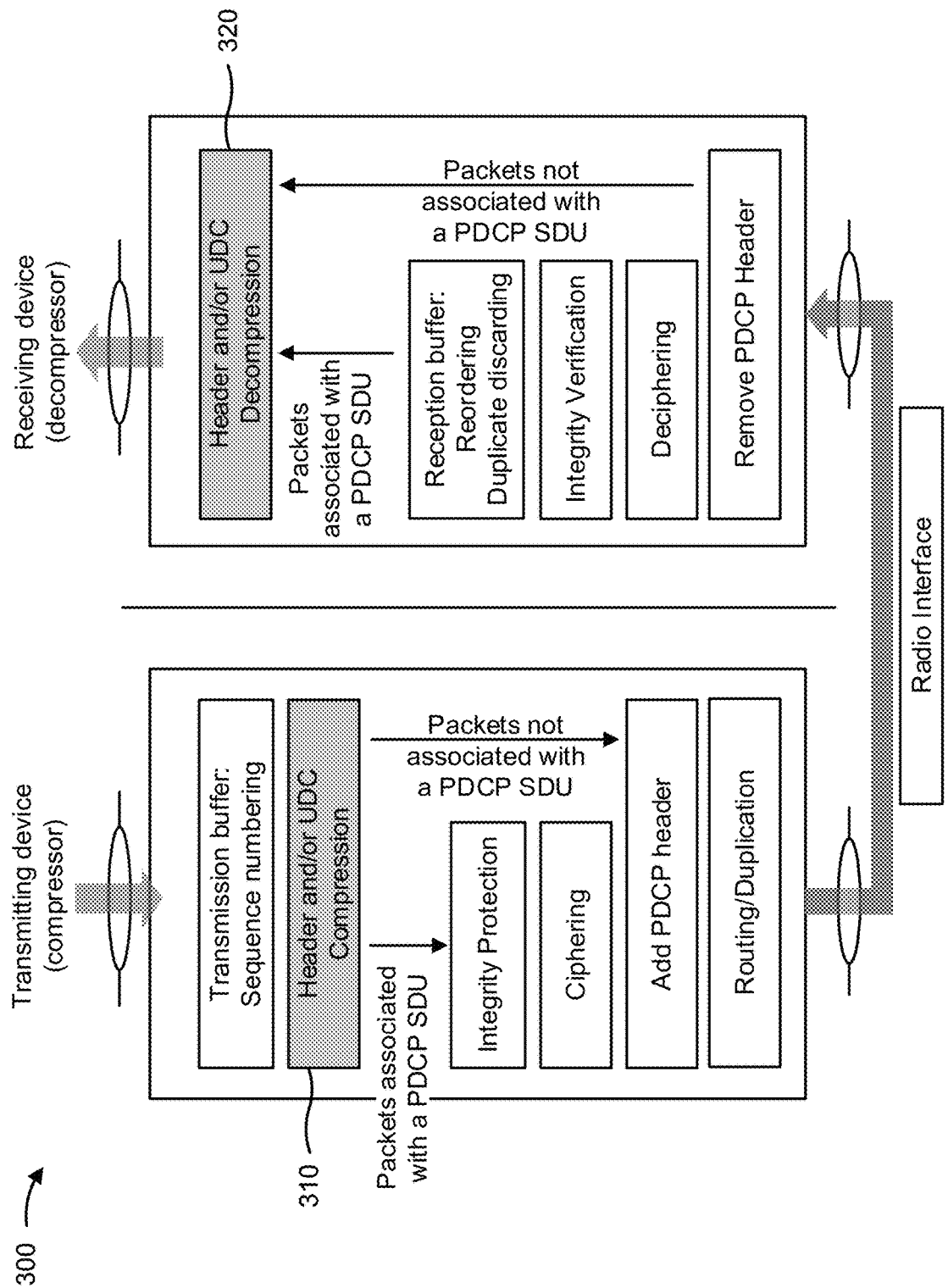
FIG. 3 is a diagram illustrating an example of a compression architecture, in accordance with the present disclosure.

FIG. 3 is a diagram illustrating an example 300 of a compression architecture, in accordance with the present disclosure.

As shown in FIG. 3, the compression architecture includes a transmitting (or compressor) device and a receiving (or decompressor) device. In some cases, the compressor device may be a base station and the decompressor device may be a UE when compression is implemented on a downlink. In some cases, the compressor device may be a UE and the decompressor device may be a base station when compression is implemented on an uplink. In some cases, the compressor device may be a UE and the decompressor device may be another UE when compression is implemented on a sidelink. In some cases, the compressor device may be a base station and the decompressor device may be another base station when compression is implemented on a backhaul.

As shown in FIG. 3, and by reference number 310, the compressor device may perform compression for a packet to be transmitted to the decompressor device. For example, as shown, the compressor device may obtain a data block to be transmitted from transmission buffer and add a sequence number to the data block to form an Ethernet packet, an Internet protocol (IP) packet, transmission control protocol (TCP) packet, a user datagram protocol (UDP) packet, a real-time transport protocol (RTP) packet or another type of packet to be transmitted.

The compressor device may then perform compression to reduce the size of the packet. In some aspects, the compressor device may perform header compression to remove the header (e.g., an Ethernet header, an IP header, a TCP header, a UDP header, an RTP header, or another type of header) from the packet and attach a compression sub-header that includes a context identifier. In some aspects, the compressor may perform uplink data compression (UDC) or another type of data compression to reduce the size of the packet. The compressor device may perform the compression based at least in part on a compression protocol or compression technique, such as robust header compression (RoHC), Ethernet header compression (EHC), UDC, memory-based compression, pattern matching based compression, and/or the like.

In some cases, if the packet is associated with a packet data convergence protocol (PDCP) service data unit (SDU), the packet may be subject to integrity protection and/or ciphering. After applying the integrity protection and/or ciphering, and/or if the packet is not associated with a PDCP SDU, the compressor device may add a PDCP header to form a protocol data unit (PDU). The compressor device may then transmit the PDU with the compressed header to the decompressor device via a radio interface (e.g., a Uu interface, a PC5 interface, and/or the like).

As further shown in FIG. 3, the decompressor device may receive the PDU from the compressor device via the radio interface and remove the PDCP header from the PDU. In cases where the packet is associated with a PDCP SDU, the decompressor device may perform deciphering and integrity verification on the packet, and the packet may be stored in a reception buffer where incoming packets may be reordered (e.g., based on sequence number), duplicate packets may be discarded, and/or the like if the packet is successfully deciphered and passes integrity verification. As shown by reference number 320, the decompressor device may perform header decompression for the packets in the reception buffer and/or for packets that are not associated with a PDCP SDU. For example, the decompressor device may obtain a context identifier (e.g., an RoHC context identifier or another type of context identifier) from the packet and match the context identifier to information contained in a full header associated with a previous packet.

As indicated above, FIG. 3 is provided as an example. Other examples may differ from what is described with regard to FIG. 3.

In some wireless networks, such as a wideband CDMA (WCDMA) wireless network or a 5G wireless network, a UE 120 may be configured to measure and report messages based at least in part on a traffic volume or a traffic size. For example, the UE 120 may be configured to measure and report traffic volume measurements (TVMs). TVMs may be configured by a base station 110 to assist the base station 110 with dynamic radio bearer control decisions. The base station 110 may configure a UE 120 with one or more TVM reporting thresholds. In some aspects, the one or more TVM reporting thresholds may be cell-level or cell-specific TVM reporting thresholds (e.g., each UE 120 within a cell associated with the base station 110 may be configured with the same TVM reporting thresholds). The one or more TVM reporting thresholds may include a threshold for reporting TVMs when a transport channel traffic volume is greater than or equal to the threshold (e.g., a reporting event 4A reporting threshold as defined, or otherwise fixed, by a wireless communication standard, such as the 3GPP), a threshold for reporting TVMs when a transport channel traffic volume is less than the threshold (e.g., a reporting event 4B reporting threshold as defined, or otherwise fixed, by a wireless communication standard, such as the 3GPP), and/or the like.

The base station 110 may use the reported TVMs to dynamically configure UEs 120 with appropriate radio bearers and/or appropriate radio resource control (RRC) states (e.g., an RRC connected state, an RRC inactive state, or an RRC idle state). For example, if a UE 120 transmits a TVM report based at least in part on detecting a reporting event 4A (e.g., based at least in part on determining a traffic volume is greater than or equal to a threshold), the base station 110 may configure (or reconfigure) the UE 120 with a radio bearer and/or an RRC state associated with a higher data rate (e.g., an RRC connected state). In contrast, if a UE 120 transmits a TVM report based at least in part on detecting a reporting event 4B (e.g., based at least in part on determining a traffic volume is less than a threshold), the base station 110 may configure (or reconfigure) the UE 120 with a radio bearer and/or RRC state associated with a lower data rate (e.g., an RRC idle state or an RRC inactive state). In some aspects, the base station 110 may determine a physical channel configuration for a UE 120 based at least in part on a TVM report. For example, the base station 110 may determine if a UE 120 should be associated with a cell forward access channel (cell-FACH) RRC state (e.g., associated with a lower data rate, a release 99 (R99) radio bearer, and/or the like) or a cell dedicated channel (cell-DCH) RRC state (e.g., associated with a higher data rate, a High Speed Downlink Packet Access (HSDPA)/High Speed Uplink Packet Access (HSUPA) radio bearer, and/or the like) based at least in part on a TVM report.

In some cases, a UE 120 may be enabled to (e.g., capable of and/or configured to) perform UDC associated with uplink transmissions by the UE 120. As a result, the UE 120 may reduce a size of an uplink transmission from an uncompressed size to a compressed size. In some aspects, the UE 120 may achieve a compression gain between 50% and 90% (e.g., the compressed size of the compressed data associated with the uplink transmission may be between 50% and 90% smaller than the uncompressed size of the data associate with the uplink transmission) by performing UDC. In some aspects, the UE 120 that is enabled to perform UDC may use a compressed size of the compressed data associated with an uplink transmission when determining if a message reporting threshold has been satisfied (e.g., a TVM reporting threshold or another threshold). However, as the size of the uplink transmission may be reduced due to the UDC operation, a likelihood that the UE 120 detects a reporting event (e.g., and reports messages to a base station 110, thereby enabling the base station 110 to configure the UE 120 with a higher data rate radio bearer and/or a higher data rate RRC state) is reduced. As a result, the UE 120 may not transmit a message (e.g., a TVM report), even when an uncompressed size of the data associated with an uplink transmission satisfies a reporting threshold, when a compressed size of compressed data associated with the uplink transmission does not satisfy the reporting threshold.

For example, a TVM reporting threshold may be 2,500 bytes (e.g., a reporting event 4A reporting threshold). A UE 120 may compress data of an uplink transmission from an uncompressed size of 10,000 bytes to a compressed size of 2,000 bytes. The UE 120 may determine that the TVM reporting threshold is not satisfied because the compressed size of 2,000 bytes is less than the TVM reporting threshold of 2,500 bytes. As a result, the UE 120 may not transmit a TVM report indicating one or more TVMs to the base station 110. Not transmitting the TVM report in this way may negatively impact a UE 120 with UDC enabled compared to a UE 120 without UDC enabled (e.g., as a UE 120 without UDC enabled may use the uncompressed size of 10,000 bytes and determine that the TVM reporting threshold is satisfied, causing the UE 120 without UDC enabled to transmit a TVM report).

Failing to transmit the TVM report in this manner increases latency-associated transitioning to radio bearers and/or RRC states that are associated with a higher data rate. The latency-associated transitioning to radio bearers and/or RRC states that are associated with a higher data rate decreases communication reliability of the UE 120, consumes UE 120 resources (e.g., power resources, radio resources, and/or the like), and/or the like. Moreover, using the compressed size of the data associated with the uplink transmission for determining if a TVM reporting threshold is satisfied increases the likelihood that a reporting event 4B is detected by the UE 120, resulting in the UE 120 being configured with lower data rate radio bearers and/or RRC states. Furthermore, the more efficient the UDC performed by the UE 120 is (e.g., the higher the compression gain achieved by the UDC), the more likely it is that the UE 120 will fail to detect the reporting event 4A. As a result, UEs 120 that are capable of performing high compression gain UDC are negatively impacted with respect to TVM reporting.

Some techniques and apparatuses described herein enable optimized traffic volume reporting. In some aspects, a UE 120 that is enabled to perform UDC may use an uncompressed size of data associated with the uplink transmission for measurement or message reporting purposes and the compressed size of compressed data associated with the uplink transmission for transmission purposes (e.g., for buffer occupancy reporting purposes). For example, the UE 120 may determine whether the uncompressed size of the data associated with the uplink transmission satisfies a reporting threshold. The UE 120 may transmit a message (e.g., a TVM report, a buffer measurement report, a request for a bandwidth part (BWP) configuration change, and/or a request for an RRC state configuration change, among other examples) based at least in part on a determination that the uncompressed size of the data associated with the uplink transmission satisfies the reporting threshold. The UE 120 may transmit a buffer occupancy report indicating the compressed size of the compressed data associated with the uplink transmission and/or a request for radio resources that is based at least in part on the compressed size of the compressed data associated with the uplink transmission. The UE 120 may receive a radio resource grant based at least in part on the request for radio resources. The UE 120 may transmit the compressed data, in the compressed size, of the uplink transmission using the granted radio resources.

Therefore, the UE 120 may be enabled to use an uncompressed size of data associated with an uplink transmission for measurement and/or reporting purposes at a Layer 2 level of the UE 120. The UE 120 may be enabled to use a compressed size of compressed data associated with the uplink transmission for buffer occupancy reporting and/or for uplink transmission purposes. The UE 120 may determine whether to transmit the message based at least in part on the uncompressed size of data associated with an uplink transmission. Consequently, the UE 120 may be enabled to receive a radio bearer reconfiguration, BWP reconfiguration, and/or RRC state reconfiguration to a radio bearer, BWP state, and/or RRC state that is associated with a higher data rate (e.g., based at least in part on the transmitting the message).

As a result, latency associated transitioning to radio bearers, BWP states, and/or RRC states that are associated with a higher data rate is reduced. Reducing the latency associated with transitioning to radio bearers, BWP states, and/or RRC states that are associated with a higher data rate increases communication reliability of the UE 120, conserves UE 120 resources (e.g., power resources, radio resources, and/or the like) that would have otherwise been used by the UE 120 in lower radio bearers, lower BWP states, and/or lower RRC states (e.g., lower data rate radio bearers, BWP states, and/or RRC states) if the compressed size of the compressed data associated with the uplink transmission was used to determine if a reporting threshold is satisfied, and/or the like. Additionally, the UE 120 is enabled to realize the benefits of utilizing UDC when transmitting the uplink transmission (e.g., conserving radio resources, UE 120 power resources, and/or the like). Moreover, using the uncompressed size of the data associated with the uplink transmission to determine if a TVM reporting threshold is satisfied reduces the likelihood that a reporting event 4B is detected by the UE 120, thereby reducing the likelihood that the UE 120 is reconfigured to a lower data rate radio bearer and/or a lower data rate RRC state. In this way, UEs 120 with UDC enabled will not be disadvantaged or negatively impacted compared to UEs 120 without UDC enabled with respect to traffic volume reporting.

Figure 4:
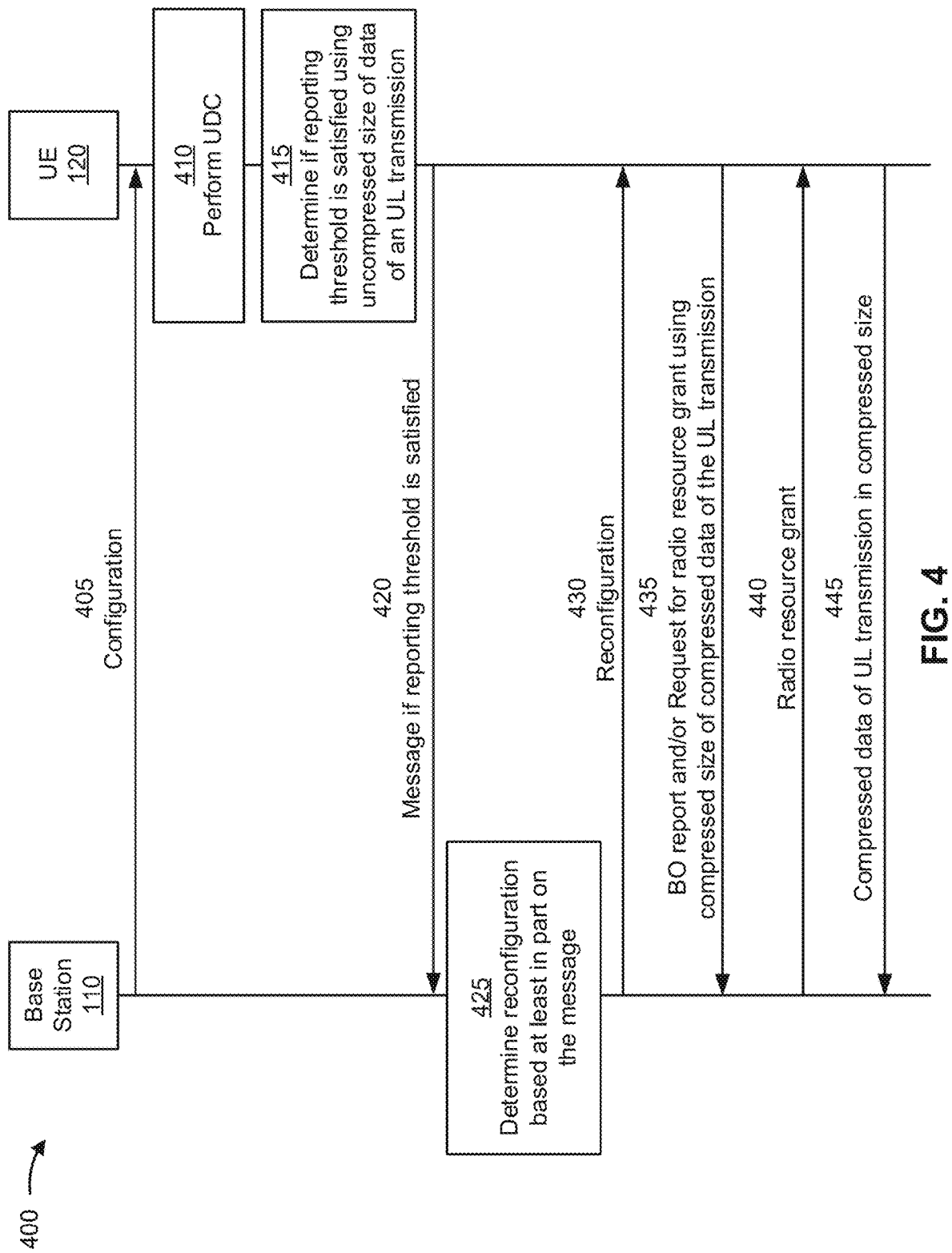
FIG. 4 is a diagram illustrating an example associated with optimized traffic volume reporting, in accordance with the present disclosure.

FIG. 4 is a diagram illustrating an example 400 associated with optimized TVM reporting, in accordance with the present disclosure. As shown in FIG. 4, example 400 includes communication between a base station 110 and a UE 120. In some aspects, the base station 110 and the UE 120 may be included in a wireless network, such as wireless network 100. In some aspects, the wireless network may be a WCDMA wireless network. The base station 110 and the UE 120 may communicate on a wireless access link, which may include an uplink and a downlink.

As shown by reference number 405, the base station 110 may transmit, and the UE 120 may receive, a configuration. The configuration may be a TVM configuration. The configuration may be an RRC configuration, may be indicated by an RRC parameter of an RRC configuration, may be transmitted using RRC signaling, and/or the like. The configuration may indicate one or more reporting thresholds, such as a TVM reporting threshold (e.g., associated with an event 4*a* or an event 4*b*), a buffer measurement threshold, and/or an RRC reconfiguration request threshold, among other examples. In some aspects, the one or more reporting thresholds may include a TVM reporting threshold that indicates that a UE 120 is to transmit a TVM report (indicating one or more TVMs) if a transport channel traffic volume becomes greater than or equal to the TVM reporting threshold (e.g., a reporting event 4A reporting threshold). In some aspects, the one or more reporting thresholds may include a TVM reporting threshold that indicates that a UE 120 is to transmit a TVM report (indicating one or more TVMs) if a transport channel traffic volume becomes less than the TVM reporting threshold (e.g., a reporting event 4B reporting threshold). In some aspects, the one or more reporting thresholds may include an RRC reconfiguration request threshold that indicates that a UE 120 is to transmit a request to change an RRC state of the UE 120 if a transport channel traffic volume satisfies the RRC reconfiguration request threshold. In some aspects, the one or more reporting thresholds may include a BWP state threshold that indicates that a UE 120 is to transmit a request to change a BWP state of the UE 120 if a transport channel traffic volume satisfies the BWP state threshold. The one or more reporting thresholds may be absolute thresholds.

For example, the UE 120 may be configured with one or more active BWPs, one or more inactive BWPs, and/or one or more dormant BWPs. "Dormant BWP" may refer to a BWP that is not configured with a physical downlink control channel (PDCCH) (e.g., a BWP that is not configured with PDCCH monitoring) and may be used for power saving, such as for when the UE 120 does not have traffic to transmit or has a small amount of traffic to transmit. A non-dormant BWP may be configured with PDCCH monitoring and/or may be associated with a higher data capacity than a dormant BWP. A non-dormant BWP may be associated with a different radio resource configuration than a radio resource configuration for a dormant BWP (e.g., a non-dormant BWP may be associated with more radio resources than a dormant BWP). For example, the UE 120 may be configured with a dormant BWP when the UE 120 does not have traffic to transmit or has a small amount of traffic to transmit and may be reconfigured with a non-dormant BWP when the UE 120 has traffic to transmit. In other words, a switch between a dormancy state of the UE 120 (e.g., in which one or more activities, such as PDCCH monitoring, of the UE 120 are reduced or eliminated) and a non-dormancy state of the UE 120 may be performed via a BWP switch, which may reduce latency associated with switching between the dormancy state and the non-dormancy state.

In some aspects, the configuration may be a cell specific configuration. In other words, the base station 110 may configure each UE 120 that is communicating with the base station 110 (e.g., each UE 120 that is located within a cell associated with the base station 110) with the same configuration. For example, the configuration may be associated with a cell level radio resource management configuration. As a result, each UE 120 that is communicating with the base station 110 may be configured with the same reporting thresholds. In other words, a UE 120 may receive the same configuration regardless of whether the UE 120 has UDC enabled. In some aspects, the configuration may configure a Layer 2 level (e.g., an RRC layer level, a PDCP layer level, a radio link control (RLC) layer level, or a medium access control (MAC) layer level) of the UE 120 with the one or more reporting thresholds.

As shown by reference number 410, the UE 120 may perform UDC of data associated with an uplink transmission. For example, the UE 120 may be capable of performing UDC. The UE 120 may indicate, to the base station 110, the capability of the UE 120 to perform UDC. The base station 110 may configure the UE 120 to perform UDC of data associated with uplink transmissions. In this way, the UE 120 may be enabled to perform UDC.

In some aspects, a modem of the UE 120 may receive data, in an uncompressed size, associated with an uplink transmission (e.g., associated with application traffic) from a host of the UE 120. The UE 120 may compress the data associated with the uplink transmission to a compressed size (e.g., using an UDC technique or protocol). For example, the host of the UE 120 may provide 10,000 bytes of data associated with an uplink transmission to the modem of the UE 120. The modem of the UE 120 may compress the 10,000 bytes of data to a compressed size of 2,000 bytes using a UDC technique or protocol.

As shown by reference number 415, the UE 120 may determine whether the uncompressed size of the data associated with the uplink transmission satisfies a threshold (e.g., a TVM reporting threshold or another reporting threshold). For example, the UE 120 may determine a transport channel traffic volume based at least in part on the uncompressed size of the data associated with the uplink transmission. The UE 120 may determine whether the transport channel traffic volume satisfies a threshold (e.g., a TVM reporting threshold or another reporting threshold). The UE 120 may determine whether to transmit a message (e.g., a TVM report, a buffer measurement report, a request for a BWP configuration change, and/or a request for an RRC state configuration change, among other examples) based at least in part on the determination of whether the uncompressed size of the data associated with the uplink transmission satisfies the threshold. With reference to the example above, the UE 120 may determine whether 10,000 bytes satisfies a configured threshold (e.g., a TVM reporting threshold configured by a TVM configuration or another threshold), rather than using the compressed size of 2,000 bytes of the compressed data associated with the uplink transmission.

As shown by reference number 420, the UE 120 may transmit, and the base station 110 may receive, a message (e.g., a TVM report, a buffer measurement report, a request for a BWP configuration change, and/or a request for an RRC state configuration change, among other examples) based at least in part on a determination that the uncompressed size of the data associated with the uplink transmission satisfies a threshold. For example, the UE 120 may determine that the uncompressed size of the data associated with the uplink transmission satisfies the threshold (e.g., a TVM reporting threshold, such as a reporting event 4A reporting threshold or a reporting event 4B reporting threshold). The UE 120 may transmit the message as a Layer 2 measurement report to the base station 110. In some aspects, the message may indicate one or more TVM values that are based at least in part on the uncompressed size of the data associated with the uplink transmission. For example, the message may indicate a buffer occupancy value of the UE 120 that is based at least in part on the uncompressed size of the data associated with the uplink transmission, an average of a buffer occupancy value of the UE 120 that is based at least in part on the uncompressed size of the data associated with the uplink transmission, a variance of a buffer occupancy value of the UE 120 that is based at least in part on the uncompressed size of the data associated with the uplink transmission, and/or the like.

In some aspects, the message may be a Layer 2 message, such as an RRC message, a PDCP message, an RLC message, and/or a MAC message, among other examples.

For example, the message may be control PDU associated with PDCP layer, control PDU associated with an RLC layer, and/or a MAC control element (MAC-CE), among other examples. In some aspects, the message may indicate a request for a change in an RRC state of the UE 120. In some aspects, the message may indicate a request for a change in a BWP configuration of the UE 120 (e.g., from a dormant BWP to a non-dormant BWP). In some aspects, the message may be a TVM report. For example, the TVM report may indicate the request for a change in an RRC state of the UE 120 and/or may indicate the request for a change in a BWP configuration of the UE 120.

As shown by reference number 425, the base station 110 may determine a reconfiguration for the UE 120 based at least in part on the message. For example, the base station 110 may receive the message and determine that the UE 120 should be reconfigured to a different radio bearer, a different BWP, a different BWP state, and/or a different RRC state based at least in part on one or more values indicated by the message. In some aspects, the base station 110 may determine that the UE 120 should be reconfigured to a higher data rate radio bearer, higher data rate or higher data capacity BWP, and/or a higher data rate RRC state (e.g., if a TVM report indicates that the UE 120 detected that the transport channel traffic value satisfied a reporting event 4A reporting threshold).

For example, the base station 110 may determine that, based at least in part of a traffic volume or an uplink buffer size (e.g., indicated by the message) experienced by the UE 120, that the UE 120 should be reconfigured to a higher data rate radio bearer, a higher data capacity BWP, and/or a higher data rate RRC state. In some aspects, the base station 110 may determine that, based at least in part on a traffic volume or an uplink buffer size (e.g., indicated by the message) experienced by the UE 120, that the UE 120 should be reconfigured to a lower data rate radio bearer, a lower data capacity BWP, and/or a higher data rate RRC state (e.g., where the UE 120 transmits a TVM report based at least in part on determining that the uncompressed size of the data associated with the uplink transmission satisfies a reporting event 4B reporting threshold).

For example, the UE 120 may be configured to operate in a cell-FACH RRC state while operating in an RRC connected mode. The base station 110 may determine, based at least in part on the message, that the UE 120 should be reconfigured to operate in a cell-DCH RRC state (e.g., that is associated with a higher data rate than a data rate associated with the cell-FACH RRC state) while operating in the RRC connected mode (e.g., where the UE 120 transmits a TVM report based at least in part on an determining that the uncompressed size of the data associated with the uplink transmission satisfies a reporting event 4A reporting threshold). In some aspects, the UE 120 may be operating using an R99 service (e.g., the UE 120 may be configured with an R99 radio bearer). The base station 110 may determine, based at least in part on the message, that the UE 120 should be reconfigured to operate using a HSDPA/HSUPA service (e.g., using an HSDPA/HSUPA radio bearer that is associated with a higher data rate than a data rate associated with the R99 radio bearer).

In some aspects, the UE 120 may be configured to operate in an RRC idle mode or an RRC inactive mode. The base station 110 may determine, based at least in part on the message, that the UE 120 should be reconfigured to operate in the RRC connected mode. In some aspects, the UE 120 may be configured to use a dormant BWP. The base station 110 may determine, based at least in part on the message, that the UE 120 should be reconfigured to operate using a non-dormant BWP (e.g., that is associated with PDCCH monitoring and/or a higher data capacity than the dormant BWP).

As shown by reference number 430, the base station 110 may transmit, and the UE 120 may receive, a reconfiguration that is based at least in part on the message. In some aspects, the reconfiguration may be an RRC reconfiguration (e.g., indicating that the UE 120 is to transition to a different RRC state). In some aspects, the reconfiguration may be a radio bearer reconfiguration (e.g., indicating that the UE 120 is to transition to a different radio bearer). In some aspects, the reconfiguration may be a physical channel reconfiguration. In some aspects, the reconfiguration may be a BWP reconfiguration (e.g., indicating that the UE 120 is to transition to a different BWP and/or a different BWP state).

The UE 120 may transition to a different radio bearer, different BWP, different BWP state, and/or a different RRC state based at least in part on receiving the reconfiguration. For example, the UE 120 may transition from a cell-FACH RRC state to a cell-DCH state based at least in part on receiving the reconfiguration. In some aspects, the UE 120 may transition from an R99 service to a HSDPA/HSUPA service (e.g., transition from an R99 radio bearer to an HSDPA/HSUPA radio bearer) based at least in part on receiving the reconfiguration. In some aspects, the UE 120 may transition from an RRC inactive state or an RRC idle state to an RRC connected state. In some aspects, the UE 120 may transition or switch from a dormant BWP to a non-dormant BWP.

As shown by reference number 435, the UE 120 may transmit, and the base station 110 may receive, a buffer occupancy report. The buffer occupancy report may indicate a buffer occupancy value. The buffer occupancy value may be based at least in part on the compressed size of the compressed data associated with the uplink transmission (e.g., 2,000 bytes in the example described above).

The UE 120 may transmit, and the base station 110 may receive, a request for a radio resource grant. The request for a radio resource grant may be a request for radio resources for transmitting the compressed data associated with the uplink transmission. The request for the radio resource grant may be based at least in part on the compressed size of the compressed data associated with the uplink transmission. With reference to the example described above, the UE 120 may transmit a request for a radio resource grant indicating that the UE 120 is requesting radio resources for transmitting 2,000 bytes of data (e.g., the compressed size of the compressed data associated with the uplink transmission).

As shown by reference number 440, the base station 110 may transmit, and the UE 120 may receive, a radio resource grant associated with the uplink transmission. For example, the base station 110 may receive the buffer occupancy report and/or the request for the radio resource grant from the UE 120. The base station 110 may determine the radio resource grant based at least in part on the buffer occupancy report and/or based at least in part on the request for the radio resource grant. For example, the base station 110 may determine a number of radio resources (e.g., time domain resources and/or frequency domain resources) to allocate to the UE 120 for the uplink transmission. The number of radio resources may be based at least in part on the compressed size of the compressed data associated with the uplink transmission. For example, the base station 110 may schedule the compressed data associated with the uplink transmission to be transmitted by the UE 120 in the compressed size. With reference to the example described above, the base station 110 may allocate a number of radio resources to the UE 120 to enable the UE 120 to transmit the 2,000 bytes of data (e.g., the compressed size of the compressed data associated with the uplink transmission).

As shown by reference number 445, the UE 120 may transmit, and the base station 110 may receive, the compressed data associated with the uplink transmission in the compressed size. The UE 120 may transmit the compressed data, over the air, using radio resources indicated by the radio resource grant. The base station 110 may receive the compressed data and decompress the compressed data to determine the uncompressed data associated with the uplink transmission.

In some aspects, the UE 120 may transmit the compressed data associated with the uplink transmission in the compressed size using the reconfigured radio bearer, the reconfigured BWP, the reconfigured BWP state, and/or the reconfigured RRC state (e.g., that were indicated by the reconfiguration that is based at least in part on the TVM report). For example, the UE 120 may transmit the compressed data associated with the uplink transmission in the compressed size after transmitting the TVM report and/or after receiving the reconfiguration. In some aspects, the UE 120 may transmit the compressed data associated with the uplink transmission in the compressed size using an original radio bearer, an original BWP, an original BWP state, and/or an original RRC state. In other words, the UE 120 may transmit the compressed data associated with the uplink transmission in the compressed size before transmitting the message and/or before receiving the reconfiguration. In that case, the UE 120 may be reconfigured to a different radio bearer, different BWP, different BWP state, and/or a different RRC state after transmitting the compressed data associated with the uplink transmission in the compressed size (e.g., the UE 120 may operate using the different radio bearer, using the different BWP, using the different BWP state, and/or in the different RRC state for subsequent uplink transmission).

Therefore, as described above, the UE 120 may be enabled to use an uncompressed size of data associated with an uplink transmission for traffic volume or buffer measurement purposes at a Layer 2 level of the UE 120. The UE 120 may be enabled to use a compressed size of compressed data associated with the uplink transmission for buffer occupancy reporting and/or for uplink transmission purposes. The UE 120 may determine whether to transmit a message based at least in part on the uncompressed size of data associated with an uplink transmission. Consequently, the UE 120 may be enabled to receive a radio bearer reconfiguration, BWP reconfiguration, and/or RRC state reconfiguration to a radio bearer, BWP, BWP state, and/or RRC state that is associated with a higher data rate or higher data capacity (e.g., based at least in part on the transmitting the message). As a result, latency associated transitioning to radio bearers, BWPs, BWP states, and/or RRC states that are associated with a higher data rate and/or a higher data capacity is reduced.

Reducing the latency associated with transitioning to radio bearers, BWPs, BWP states, and/or RRC states that are associated with a higher data rate and/or a higher data capacity increases communication reliability of the UE 120, conserves UE 120 resources (e.g., power resources, radio resources, and/or the like) that would have otherwise been used by the UE 120 in lower radio bearers, lower BWPs, lower BWP states, and/or lower RRC states (e.g., lower data rate or data capacity radio bearers, BWPs, BWP states, and/or RRC states) if the compressed size of the compressed data associated with the uplink transmission was used to determine if a reporting threshold is satisfied, and/or the like.

Additionally, the UE 120 is enabled to realize the benefits of utilizing UDC when transmitting the uplink transmission (e.g., conserving radio resources, UE 120 power resources, and/or the like). Moreover, using the uncompressed size of the data associated with the uplink transmission to determine if a TVM reporting threshold is satisfied reduces the likelihood that a reporting event 4B is detected by the UE 120, thereby reducing the likelihood that the UE 120 is reconfigured to a lower data rate radio bearer and/or a lower data rate RRC state. In this way, UEs 120 with UDC enabled will not be disadvantaged compared to UEs 120 without UDC enabled with respect to TVM reporting.

As indicated above, FIG. 4 is provided as an example. Other examples may differ from what is described with respect to FIG. 4.

Figure 5:
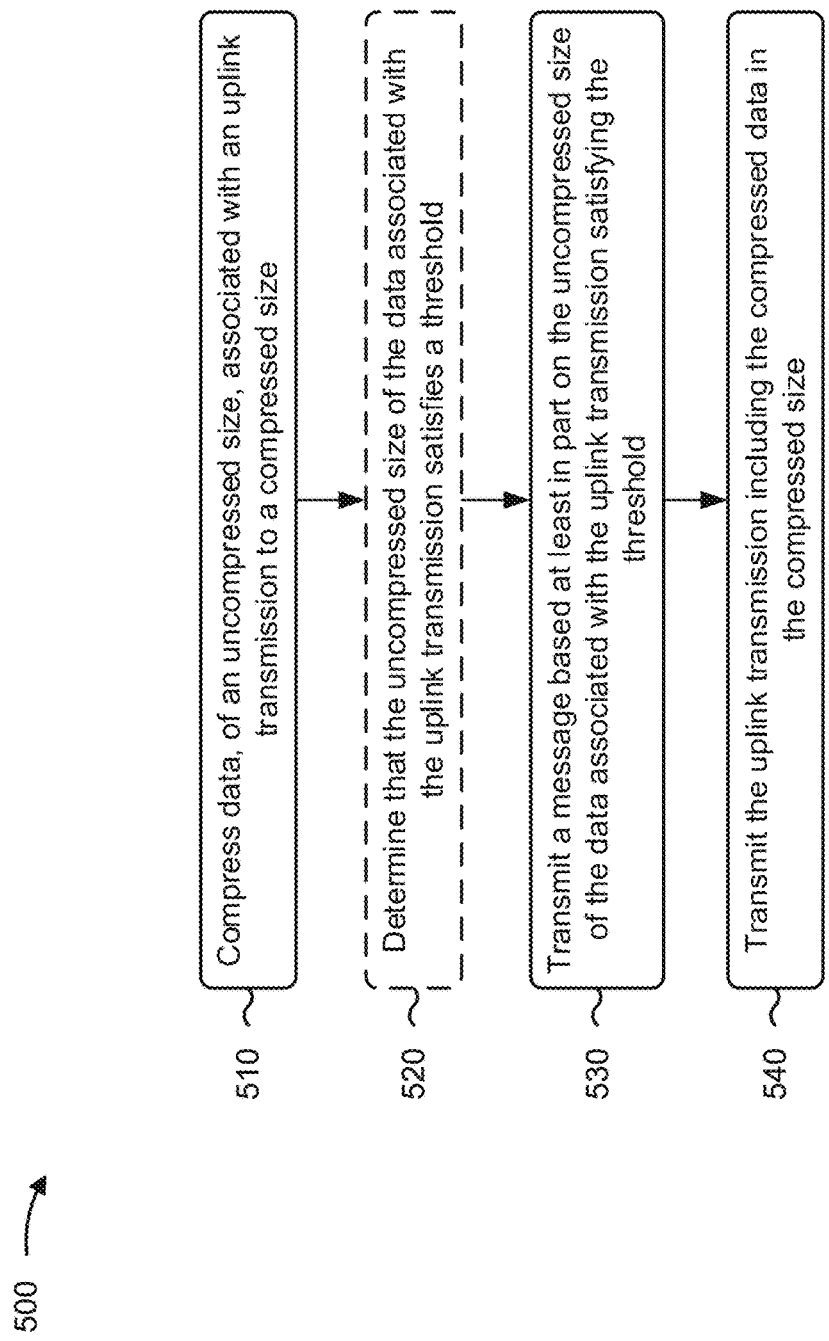
FIG. 5 is a diagram illustrating an example process associated with optimized traffic volume measurement (TVM) reporting, in accordance with the present disclosure.

FIG. 5 is a diagram illustrating an example process 500 performed, for example, by a UE, in accordance with the present disclosure. Example process 500 is an example where the UE (e.g., UE 120) performs operations associated with optimized TVM reporting.

As shown in FIG. 5, in some aspects, process 500 may include compressing data, of an uncompressed size, associated with an uplink transmission to a compressed size (block 510). For example, the UE (e.g., using antenna 252, demodulator 254, MIMO detector 256, receive processor 258, transmit processor 264, TX MIMO processor 266, modulator 254, controller/processor 280, memory 282, and/or compression component 608 depicted in FIG. 6) may compress data, of an uncompressed size, associated with an uplink transmission to a compressed size, as described above. In some aspects, the operation of block 510 may be performed by the compression component 608 depicted in FIG. 6.

As further shown in FIG. 5, in some aspects, process 500 may optionally include determining that the uncompressed size of the data associated with the uplink transmission satisfies a threshold (block 520). For example, the UE (e.g., using antenna 252, demodulator 254, MIMO detector 256, receive processor 258, transmit processor 264, TX MIMO processor 266, modulator 254, controller/processor 280, memory 282, and/or determination component 610 depicted in FIG. 6) may determine that the uncompressed size of the data associated with the uplink transmission satisfies a threshold, as described above. In some aspects, the operation of block 520 may be performed by the determination component 610 depicted in FIG. 6

As further shown in FIG. 5, in some aspects, process 500 may include transmitting a message based at least in part on the uncompressed size of the data associated with the uplink transmission satisfying a threshold (block 530). For example, the UE (e.g., using antenna 252, transmit processor 264, TX MIMO processor 266, modulator 254, controller/processor 280, memory 282, and/or transmission component 604 depicted in FIG. 6) may transmit a message based at least in part on the uncompressed size of the data associated with the uplink transmission satisfying the threshold, as described above. In some aspects, the operation of block 530 may be performed by the transmission component 604 depicted in FIG. 6.

As further shown in FIG. 5, in some aspects, process 500 may include transmitting the uplink transmission including the compressed data in the compressed size (block 540). For example, the UE (e.g., using antenna 252, transmit processor 264, TX MIMO processor 266, modulator 254, controller/processor 280, memory 282, and/or transmission component 604 depicted in FIG. 6) may transmit the uplink transmission including the compressed data in the compressed size, as described above. In some aspects, the operation of block 540 may be performed by the transmission component 604 depicted in FIG. 6.

Process 500 may include additional aspects, such as any single aspect or any combination of aspects described below and/or in connection with one or more other processes described elsewhere herein.

Figure 6:
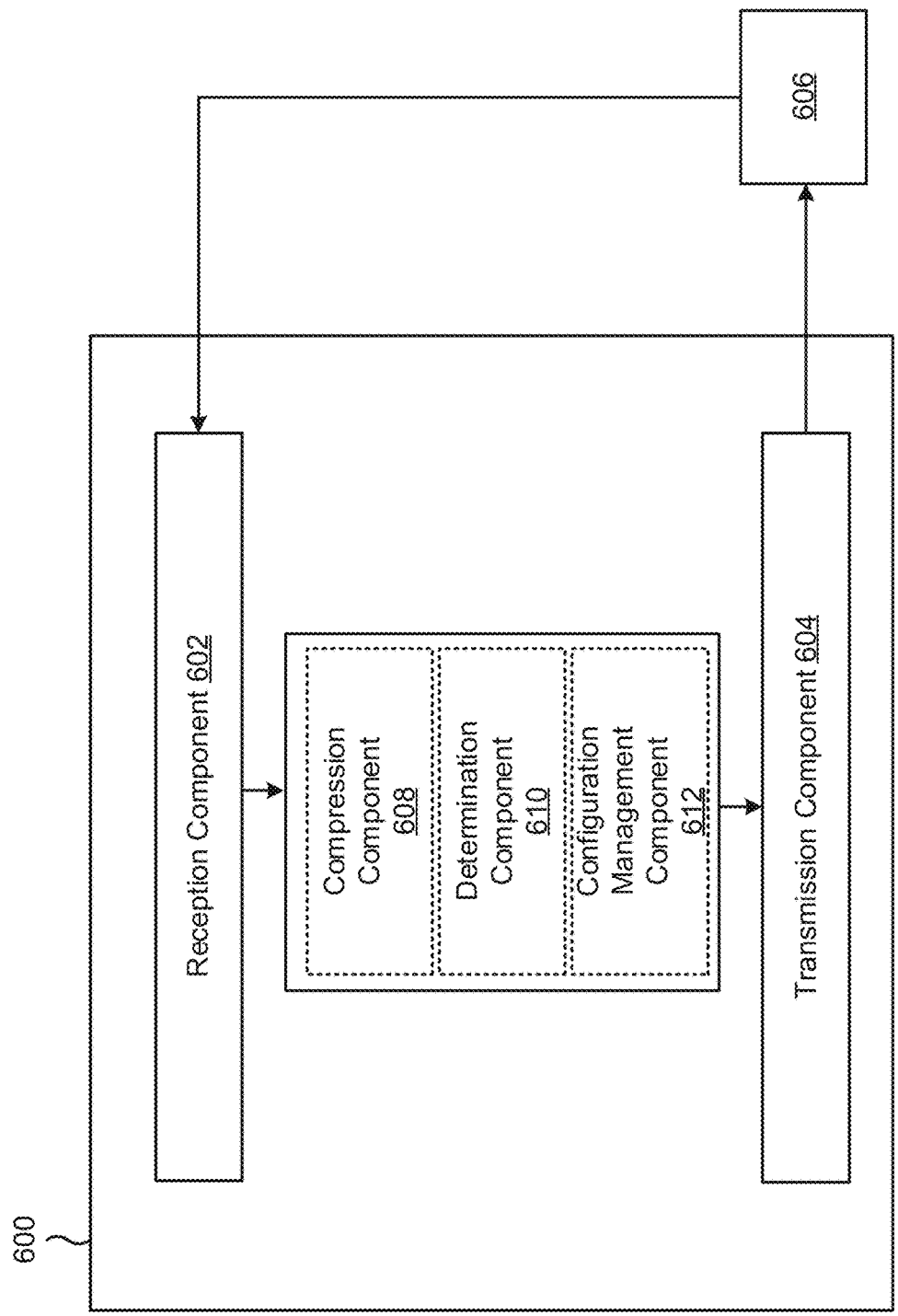
FIGS. 6 and 7 are block diagrams of example apparatuses for wireless communication, in accordance with the present disclosure.

In a first aspect, process 500 includes determining (e.g., using controller/processor 280, memory 282, and/or determination component 610 depicted in FIG. 6) to transmit the message based at least in part on determining that the uncompressed size of the data associated with the uplink transmission satisfies the threshold.

In a second aspect, alone or in combination with the first aspect, transmitting the message comprises determining (e.g., using controller/processor 280, memory 282, and/or determination component 610 depicted in FIG. 6) a transport channel traffic volume based at least in part on the uncompressed size of the data associated with the uplink transmission, and determining (e.g., using controller/processor 280, memory 282, and/or determination component 610 depicted in FIG. 6) that the transport channel traffic volume satisfies the threshold.

In a third aspect, alone or in combination with one or more of the first and second aspects, process 500 includes receiving (e.g., using antenna 252, DEMOD 254, MIMO detector 256, receive processor 258, controller/processor 280, memory 282, and/or reception component 602 depicted in FIG. 6) a configuration indicating the threshold.

In a fourth aspect, alone or in combination with one or more of the first through third aspects, the configuration is a radio resource control configuration.

In a fifth aspect, alone or in combination with one or more of the first through fourth aspects, transmitting the uplink transmission including the compressed data in the compressed size comprises transmitting (e.g., using controller/processor 280, transmit processor 264, TX MIMO processor 266, MOD 254, antenna 252, memory 282, and/or transmission component 604 depicted in FIG. 6) a buffer occupancy report indicating the compressed size of the compressed data.

In a sixth aspect, alone or in combination with one or more of the first through fifth aspects, transmitting the uplink transmission including the compressed data in the compressed size comprises transmitting (e.g., using controller/processor 280, transmit processor 264, TX MIMO processor 266, MOD 254, antenna 252, memory 282, and/or transmission component 604 depicted in FIG. 6) a request for radio resources for the compressed data, wherein the request is based at least in part on the compressed size of the compressed data, and receiving (e.g., using antenna 252, DEMOD 254, MIMO detector 256, receive processor 258, controller/processor 280, memory 282, and/or reception component 602 depicted in FIG. 6) a radio resource grant based at least in part on the transmission of the request for radio resources for the compressed data.

In a seventh aspect, alone or in combination with one or more of the first through sixth aspects, the message indicates at least one of a buffer occupancy value that is based at least in part on the uncompressed size of the data associated with the uplink transmission, an average of a buffer occupancy value that is based at least in part on the uncompressed size of the data associated with the uplink transmission, or a variance of a buffer occupancy value that is based at least in part on the uncompressed size of the data associated with the uplink transmission.

In an eighth aspect, alone or in combination with one or more of the first through seventh aspects, process 500 includes receiving (e.g., using antenna 252, DEMOD 254, MIMO detector 256, receive processor 258, controller/processor 280, memory 282, and/or reception component 602 depicted in FIG. 6) a radio bearer reconfiguration based at least in part on the transmission of the message, and transitioning (e.g., using controller/processor 280, memory 282, and/or configuration management component 612 depicted in FIG. 6) to a different radio bearer configuration based at least in part on the reception of the radio bearer reconfiguration.

In a ninth aspect, alone or in combination with one or more of the first through eighth aspects, process 500 includes receiving (e.g., using antenna 252, DEMOD 254, MIMO detector 256, receive processor 258, controller/processor 280, memory 282, and/or reception component 602 depicted in FIG. 6) a physical channel reconfiguration based at least in part on the transmission of the message, and transitioning (e.g., using controller/processor 280, memory 282, and/or configuration management component 612 depicted in FIG. 6) to a different physical channel configuration based at least in part on the reception of the physical channel reconfiguration.

In a tenth aspect, alone or in combination with one or more of the first through ninth aspects, process 500 includes receiving (e.g., using antenna 252, DEMOD 254, MIMO detector 256, receive processor 258, controller/processor 280, memory 282, and/or reception component 602 depicted in FIG. 6) a radio resource control state reconfiguration based at least in part on the transmission of the message, and transitioning (e.g., using controller/processor 280, memory 282, and/or configuration management component 612 depicted in FIG. 6) to a different radio resource control state based at least in part on the reception of the radio resource control state reconfiguration.

In an eleventh aspect, alone or in combination with one or more of the first through tenth aspects, the message is a Layer 2 measurement report.

In a twelfth aspect, alone or in combination with one or more of the first through eleventh aspects, transmitting the message includes transmitting a request for a change in a radio resource control state of the UE.

In a thirteenth aspect, alone or in combination with one or more of the first through twelfth aspects, the message is a TVM report, a Layer 2 measurement report, or a buffer measurement report.

In a fourteenth aspect, alone or in combination with one or more of the first through thirteenth aspects, the message is at least one of an RRC message, a PDCP message, an RLC message, or a MAC message.

In a fifteenth aspect, alone or in combination with one or more of the first through fourteenth aspects, the message is at least one of a control PDU associated with a PDCP layer, control PDU associated with an RLC layer, or a MAC control element.

In a sixteenth aspect, alone or in combination with one or more of the first through fifteenth aspects, the message indicates a request for a change in a BWP configuration, and process 500 includes receiving a BWP reconfiguration based at least in part on the transmission of the message; and transitioning to a different BWP configuration based at least in part on the reception of the BWP reconfiguration.

Although FIG. 5 shows example blocks of process 500, in some aspects, process 500 may include additional blocks, fewer blocks, different blocks, or differently arranged blocks than those depicted in FIG. 5. Additionally, or alternatively, two or more of the blocks of process 500 may be performed in parallel.

FIG. 6 is a block diagram of an example apparatus 600 for wireless communication. The apparatus 600 may be a UE, or a UE may include the apparatus 600. In some aspects, the apparatus 600 includes a reception component 602 and a transmission component 604, which may be in communication with one another (for example, via one or more buses and/or one or more other components). As shown, the apparatus 600 may communicate with another apparatus 606 (such as a UE, a base station, or another wireless communication device) using the reception component 602 and the transmission component 604. As further shown, the apparatus 600 may include one or more of a compression component 608, a determination component 610, or a configuration management component 612, among other examples.

In some aspects, the apparatus 600 may be configured to perform one or more operations described herein in connection with FIG. 4. Additionally or alternatively, the apparatus 600 may be configured to perform one or more processes described herein, such as process 500 of FIG. 5, or a combination thereof. In some aspects, the apparatus 600 and/or one or more components shown in FIG. 6 may include one or more components of the UE described above in connection with FIG. 2. Additionally, or alternatively, one or more components shown in FIG. 6 may be implemented within one or more components described above in connection with FIG. 2. Additionally or alternatively, one or more components of the set of components may be implemented at least in part as software stored in a memory. For example, a component (or a portion of a component) may be implemented as instructions or code stored in a non-transitory computer-readable medium and executable by a controller or a processor to perform the functions or operations of the component.

The reception component 602 may receive communications, such as reference signals, control information, data communications, or a combination thereof, from the apparatus 606. The reception component 602 may provide received communications to one or more other components of the apparatus 600. In some aspects, the reception component 602 may perform signal processing on the received communications (such as filtering, amplification, demodulation, analog-to-digital conversion, demultiplexing, deinterleaving, de-mapping, equalization, interference cancellation, or decoding, among other examples), and may provide the processed signals to the one or more other components of the apparatus 606. In some aspects, the reception component 602 may include one or more antennas, a demodulator, a MIMO detector, a receive processor, a controller/processor, a memory, or a combination thereof, of the UE described above in connection with FIG. 2.

The transmission component 604 may transmit communications, such as reference signals, control information, data communications, or a combination thereof, to the apparatus 606. In some aspects, one or more other components of the apparatus 606 may generate communications and may provide the generated communications to the transmission component 604 for transmission to the apparatus 606. In some aspects, the transmission component 604 may perform signal processing on the generated communications (such as filtering, amplification, modulation, digital-to-analog conversion, multiplexing, interleaving, mapping, or encoding, among other examples), and may transmit the processed signals to the apparatus 606. In some aspects, the transmission component 604 may include one or more antennas, a modulator, a transmit MIMO processor, a transmit processor, a controller/processor, a memory, or a combination thereof, of the UE described above in connection with FIG. 2. In some aspects, the transmission component 604 may be collocated with the reception component 602 in a transceiver.

The compression component 608 may compress data, of an uncompressed size, associated with an uplink transmission to a compressed size. In some aspects, the compression component 608 may include one or more antennas, a demodulator, a MIMO detector, a receive processor, a modulator, a transmit MIMO processor, a transmit processor, a controller/processor, a memory, or a combination thereof, of the UE described above in connection with FIG. 2. The determination component 610 may determine that the uncompressed size of the data associated with the uplink transmission satisfies a threshold. In some aspects, the determination component 610 may include a receive processor, a transmit MIMO processor, a transmit processor, a controller/processor, a memory, or a combination thereof, of the UE described above in connection with FIG. 2. The transmission component 604 may transmit a message based at least in part on the uncompressed size of the data associated with the uplink transmission satisfying the threshold. The transmission component 604 may transmit the compressed data in the compressed size.

The determination component 610 may determine to transmit the message based at least in part on the determination that the uncompressed size of the data associated with the uplink transmission satisfies the threshold. The reception component 602 may receive a configuration indicating the threshold.

The reception component 602 may receive a radio bearer reconfiguration based at least in part on the transmission of the message. The configuration management component 612 may cause the UE to transition to a different radio bearer configuration based at least in part on the reception of the radio bearer reconfiguration. In some aspects, the configuration management component 612 may include a receive processor, a transmit MIMO processor, a transmit processor, a controller/processor, a memory, or a combination thereof, of the UE described above in connection with FIG. 2.

The reception component 602 may receive a physical channel reconfiguration based at least in part on the transmission of the message. The configuration management component 612 may cause the UE to transition to a different physical channel configuration based at least in part on the reception of the physical channel reconfiguration.

The reception component 602 may receive an RRC state reconfiguration based at least in part on the transmission of the message. The configuration management component 612 may cause the UE to transition to a different RRC state based at least in part on the reception of the radio resource control state reconfiguration.

The reception component 602 may receive an RRC a BWP reconfiguration based at least in part on the transmission of the message. The configuration management component 612 may cause the UE to transition to a different BWP configuration based at least in part on the reception of the BWP reconfiguration.

The number and arrangement of components shown in FIG. 6 are provided as an example. In practice, there may be additional components, fewer components, different components, or differently arranged components than those shown in FIG. 6. Furthermore, two or more components shown in FIG. 6 may be implemented within a single component, or a single component shown in FIG. 6 may be implemented as multiple, distributed components. Additionally or alternatively, a set of (one or more) components shown in FIG. 6 may perform one or more functions described as being performed by another set of components shown in FIG. 6.

Figure 7:
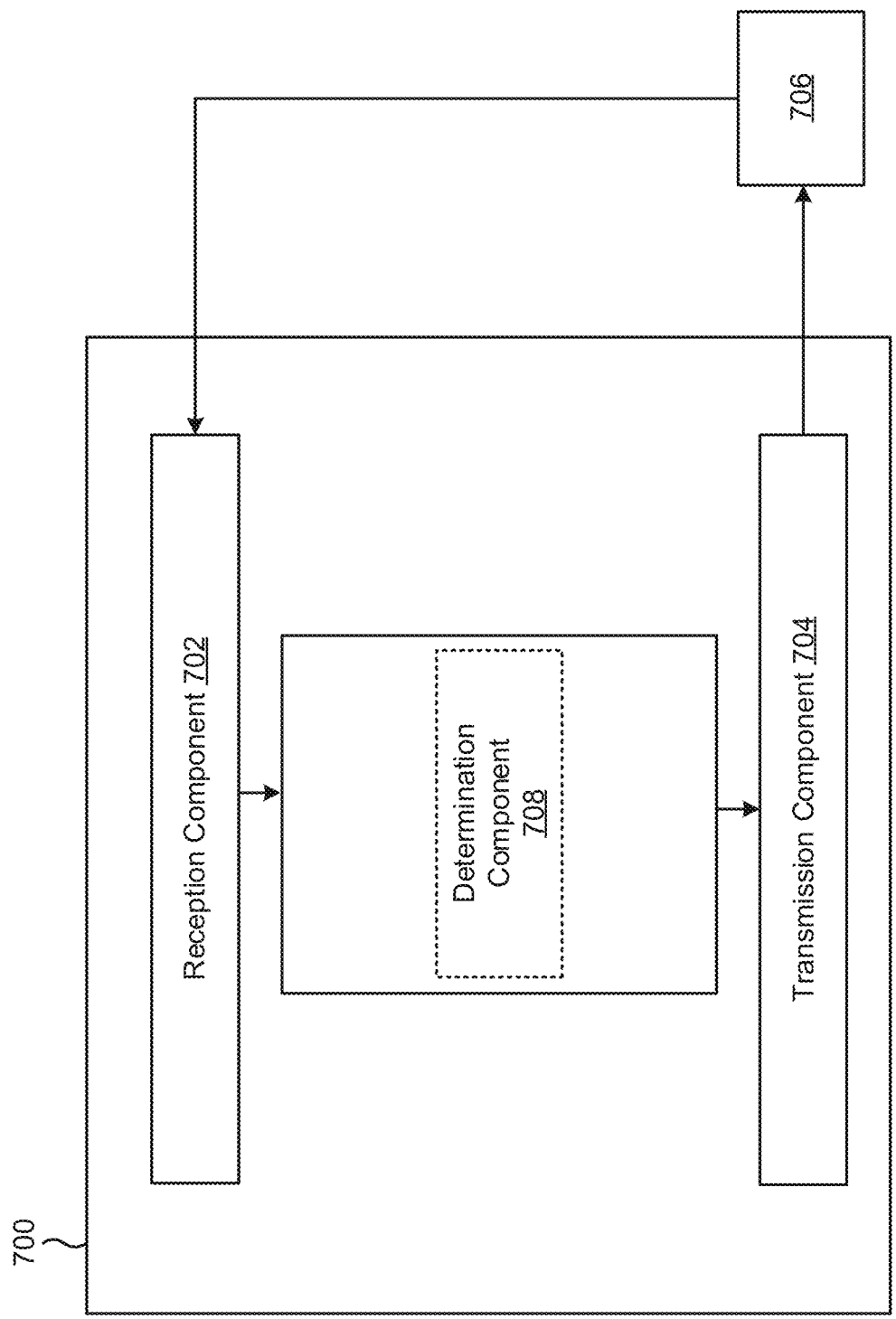

FIG. 7 is a block diagram of an example apparatus 700 for wireless communication. The apparatus 700 may be a base station, or a base station may include the apparatus 700. In some aspects, the apparatus 700 includes a reception component 702 and a transmission component 704, which may be in communication with one another (for example, via one or more buses and/or one or more other components). As shown, the apparatus 700 may communicate with another apparatus 706 (such as a UE, a base station, or another wireless communication device) using the reception component 702 and the transmission component 704. As further shown, the apparatus 700 may include one or more of a determination component 708, among other examples.

In some aspects, the apparatus 700 may be configured to perform one or more operations described herein in connection with FIG. 4. Additionally or alternatively, the apparatus 700 may be configured to perform one or more processes described herein, such as a process performed by a base station, or a combination thereof. In some aspects, the apparatus 700 and/or one or more components shown in FIG. 7 may include one or more components of the base station described above in connection with FIG. 2. Additionally, or alternatively, one or more components shown in FIG. 7 may be implemented within one or more components described above in connection with FIG. 2. Additionally or alternatively, one or more components of the set of components may be implemented at least in part as software stored in a memory. For example, a component (or a portion of a component) may be implemented as instructions or code stored in a non-transitory computer-readable medium and executable by a controller or a processor to perform the functions or operations of the component.

The reception component 702 may receive communications, such as reference signals, control information, data communications, or a combination thereof, from the apparatus 706. The reception component 702 may provide received communications to one or more other components of the apparatus 700. In some aspects, the reception component 702 may perform signal processing on the received communications (such as filtering, amplification, demodulation, analog-to-digital conversion, demultiplexing, deinterleaving, de-mapping, equalization, interference cancellation, or decoding, among other examples), and may provide the processed signals to the one or more other components of the apparatus 706. In some aspects, the reception component 702 may include one or more antennas, a demodulator, a MIMO detector, a receive processor, a controller/processor, a memory, or a combination thereof, of the base station described above in connection with FIG. 2.

The transmission component 704 may transmit communications, such as reference signals, control information, data communications, or a combination thereof, to the apparatus 706. In some aspects, one or more other components of the apparatus 706 may generate communications and may provide the generated communications to the transmission component 704 for transmission to the apparatus 706. In some aspects, the transmission component 704 may perform signal processing on the generated communications (such as filtering, amplification, modulation, digital-to-analog conversion, multiplexing, interleaving, mapping, or encoding, among other examples), and may transmit the processed signals to the apparatus 706. In some aspects, the transmission component 704 may include one or more antennas, a modulator, a transmit MIMO processor, a transmit processor, a controller/processor, a memory, or a combination thereof, of the base station described above in connection with FIG. 2. In some aspects, the transmission component 704 may be collocated with the reception component 702 in a transceiver.

The reception component 702 may receive a message based at least in part on an uncompressed size of data associated with an uplink transmission satisfying a threshold. The reception component 702 may receive, from a UE, compressed data associated with the uplink transmission in a compressed size. The reception component 702 may receive a request for a radio resource grant associated with the transmission of the compressed data associated with the uplink transmission in the compressed size. The determination component 708 may determine a radio resource grant based at least in part on at least one of the request for radio resource grant or a buffer occupancy report. In some aspects, the determination component 708 may include a receive processor, a transmit MIMO processor, a transmit processor, a controller/processor, a memory, or a combination thereof, of the base station described above in connection with FIG. 2. The transmission component 704 may transmit, to the UE, the radio resource grant. The transmission component 704 may transmit, to the UE, a configuration indicating one or more thresholds associated with transmitting messages.

The determination component 708 may determine a reconfiguration for the UE based at least in part on the message. The determination component 708 may determine a radio bearer reconfiguration based at least in part on the message. The transmission component 704 may transmit, to the UE, the radio bearer reconfiguration.

The determination component 708 may determine a physical channel reconfiguration based at least in part on the message. The transmission component 704 may transmit, to the UE, the physical channel reconfiguration.

The determination component 708 may determine an RRC state reconfiguration based at least in part on the message. The transmission component 704 may transmit, to the UE, the RRC state reconfiguration.

The determination component 708 may determine a BWP reconfiguration based at least in part on the message. The transmission component 704 may transmit, to the UE, the BWP reconfiguration.

The number and arrangement of components shown in FIG. 7 are provided as an example. In practice, there may be additional components, fewer components, different components, or differently arranged components than those shown in FIG. 7. Furthermore, two or more components shown in FIG. 7 may be implemented within a single component, or a single component shown in FIG. 7 may be implemented as multiple, distributed components. Additionally or alternatively, a set of (one or more) components shown in FIG. 7 may perform one or more functions described as being performed by another set of components shown in FIG. 7.

The following provides an overview of some Aspects of the present disclosure:

Aspect 1: A method of wireless communication performed by a user equipment (UE), comprising: compressing data, of an uncompressed size, associated with an uplink transmission to a compressed size; transmitting a message based at least in part on the uncompressed size of the data associated with the uplink transmission satisfying a threshold; and transmitting the uplink transmission including the compressed data in the compressed size.

Aspect 2: The method of Aspect 1, further comprising: determining to transmit the message based at least in part on determining that the uncompressed size of the data associated with the uplink transmission satisfies the threshold.

Aspect 3: The method of any of Aspects 1-2, wherein transmitting the message comprises: determining a transport channel traffic volume based at least in part on the uncompressed size of the data associated with the uplink transmission; and determining that the transport channel traffic volume satisfies the threshold.

Aspect 4: The method of any of Aspects 1-3, further comprising: receiving a configuration indicating the threshold.

Aspect 5: The method of Aspect 4, wherein the configuration is a radio resource control configuration.

Aspect 6: The method of any of Aspects 1-5, wherein transmitting the uplink transmission including the compressed data in the compressed size comprises: transmitting a buffer occupancy report indicating the compressed size of the compressed data.

Aspect 7: The method of any of Aspects 1-6, wherein transmitting the uplink transmission including the compressed data in the compressed size comprises: transmitting a request for radio resources for the compressed data, wherein the request is based at least in part on the compressed size of the compressed data; and receiving a radio resource grant based at least in part on the transmission of the request for radio resources for the compressed data.

Aspect 8: The method of any of Aspects 1-7, wherein the message indicates at least one of: a buffer occupancy value that is based at least in part on the uncompressed size of the data associated with the uplink transmission, an average of a buffer occupancy value that is based at least in part on the uncompressed size of the data associated with the uplink transmission, or a variance of a buffer occupancy value that is based at least in part on the uncompressed size of the data associated with the uplink transmission.

Aspect 9: The method of any of Aspects 1-8, further comprising: receiving a radio bearer reconfiguration based at least in part on the transmission of the message; and transitioning to a different radio bearer configuration based at least in part on the reception of the radio bearer reconfiguration.

Aspect 10: The method of any of Aspects 1-9, further comprising: receiving a physical channel reconfiguration based at least in part on the transmission of the message; and transitioning to a different physical channel configuration based at least in part on the reception of the physical channel reconfiguration.

Aspect 11: The method of any of Aspects 1-10, further comprising: receiving a radio resource control state reconfiguration based at least in part on the transmission of the message; and transitioning to a different radio resource control state based at least in part on the reception of the radio resource control state reconfiguration.

Aspect 12: The method of Aspect 11, wherein transmitting the message comprises transmitting a request for a change in a radio resource control state of the UE.

Aspect 13: The method of any of Aspects 1-12, wherein the message is a Layer 2 measurement report.

Aspect 14: The method of any of Aspects 1-13, wherein the message is a traffic volume measurement (TVM) report, a Layer 2 measurement report, or a buffer measurement report.

Aspect 15: The method of any of Aspects 1-14, wherein the message is at least one of a radio resource control (RRC) message, a packet data convergence protocol (PDCP) message, a radio link control (RLC) message, or a medium access control (MAC) message.

Aspect 16: The method of any of Aspects 1-15, wherein the message is at least one of a control protocol data unit (PDU) associated with a packet data convergence protocol (PDCP) layer, control PDU associated with a radio link control (RLC) layer, or a medium access control (MAC) control element.

Aspect 17: The method of any of Aspects 1-16, wherein the message indicates a request for a change in a bandwidth part (BWP) configuration, the method further comprising: receiving a bandwidth part (BWP) reconfiguration based at least in part on the transmission of the message; and transitioning to a different BWP configuration based at least in part on the reception of the BWP reconfiguration.

Aspect 18: An apparatus for wireless communication at a device, comprising a processor; memory coupled with the processor; and instructions stored in the memory and executable by the processor to cause the apparatus to perform the method of one or more of Aspects 1-17.

Aspect 19: A device for wireless communication, comprising a memory and one or more processors coupled to the memory, the one or more processors configured to perform the method of one or more of Aspects 1-17.

Aspect 20: An apparatus for wireless communication, comprising at least one means for performing the method of one or more of Aspects 1-17.

Aspect 21: A non-transitory computer-readable medium storing code for wireless communication, the code comprising instructions executable by a processor to perform the method of one or more of Aspects 1-17.

Aspect 22: A non-transitory computer-readable medium storing a set of instructions for wireless communication, the set of instructions comprising one or more instructions that, when executed by one or more processors of a device, cause the device to perform the method of one or more of Aspects 1-17.

The foregoing disclosure provides illustration and description, but is not intended to be exhaustive or to limit the aspects to the precise forms disclosed. Modifications and variations may be made in light of the above disclosure or may be acquired from practice of the aspects.

As used herein, the term "component" is intended to be broadly construed as hardware, firmware, and/or a combination of hardware and software. As used herein, a processor is implemented in hardware, firmware, and/or a combination of hardware and software. It will be apparent that systems and/or methods described herein may be implemented in different forms of hardware, firmware, and/or a combination of hardware and software. The actual specialized control hardware or software code used to implement these systems and/or methods is not limiting of the aspects. Thus, the operation and behavior of the systems and/or methods were described herein without reference to specific software code—it being understood that software and hardware can be designed to implement the systems and/or methods based, at least in part, on the description herein.

As used herein, satisfying a threshold may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of various aspects. In fact, many of these features may be combined in ways not specifically recited in the claims and/or disclosed in the specification. Although each dependent claim listed below may directly depend on only one claim, the disclosure of various aspects includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Furthermore, as used herein, the terms "set" and "group" are intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. A method of wireless communication performed by a user equipment (UE), comprising:
    compressing data, of an uncompressed size, associated with an uplink transmission to a compressed size;
    receiving a configuration indicating a threshold associated with the uncompressed size, wherein the configuration comprises a radio resource control configuration;
    transmitting a message based at least in part on the uncompressed size of the data associated with the uplink transmission satisfying the threshold; and
    transmitting the uplink transmission including the compressed data in the compressed size.

2. The method of claim 1, wherein transmitting the uplink transmission including the compressed data in the compressed size comprises:
    transmitting a buffer occupancy report indicating the compressed size of the compressed data.

3. The method of claim 1, wherein transmitting the uplink transmission including the compressed data in the compressed size comprises:
    transmitting a request for radio resources for the compressed data, wherein the request is based at least in part on the compressed size of the compressed data; and
    receiving a radio resource grant based at least in part on the transmission of the request for radio resources for the compressed data.

4. The method of claim 1, wherein the message indicates at least one of:
    a buffer occupancy value that is based at least in part on the uncompressed size of the data associated with the uplink transmission,
    an average of a buffer occupancy value that is based at least in part on the uncompressed size of the data associated with the uplink transmission, or
    a variance of a buffer occupancy value that is based at least in part on the uncompressed size of the data associated with the uplink transmission.

5. The method of claim 1, further comprising:
    receiving a radio bearer reconfiguration based at least in part on the transmission of the message; and
    transitioning to a different radio bearer configuration based at least in part on receiving the radio bearer reconfiguration.

6. The method of claim 1, further comprising:
    receiving a physical channel reconfiguration based at least in part on the transmission of the message; and
    transitioning to a different physical channel configuration based at least in part on receiving the physical channel reconfiguration.

7. The method of claim 1, further comprising:
    receiving a radio resource control state reconfiguration based at least in part on the transmission of the message; and
    transitioning to a different radio resource control state based at least in part on receiving the radio resource control state reconfiguration.

8. The method of claim 7, wherein transmitting the message comprises transmitting a request for a change in a radio resource control state of the UE.

9. The method of claim 1, wherein the message is a traffic volume measurement (TVM) report, a Layer 2 measurement report, or a buffer measurement report.

10. The method of claim 1, wherein the message is at least one of a radio resource control (RRC) message, a packet data convergence protocol (PDCP) message, a radio link control (RLC) message, or a medium access control (MAC) message.

11. The method of claim 1, wherein the message is at least one of a control protocol data unit (PDU) associated with a packet data convergence protocol (PDCP) layer, control PDU associated with a radio link control (RLC) layer, or a medium access control (MAC) control element.

12. The method of claim 1, wherein the message indicates a request for a change in a bandwidth part (BWP) configuration, the method further comprising:
    receiving a bandwidth part (BWP) reconfiguration based at least in part on the transmission of the message; and
    transitioning to a different BWP configuration based at least in part on receiving the BWP reconfiguration.

13. A user equipment (UE) for wireless communication, comprising:
    a memory; and
    one or more processors coupled to the memory, the memory and the one or more processors configured to:
        compress data, of an uncompressed size, associated with an uplink transmission to a compressed size;
        receive a configuration indicating a threshold associated with the uncompressed size, wherein the configuration comprises a radio resource control configuration;
        transmit a message based at least in part on the uncompressed size of the data associated with the uplink transmission satisfying a threshold; and
        transmit the compressed data in the compressed size.

14. The UE of claim 13, wherein the one or more processors, to transmit the uplink transmission including the compressed data in the compressed size, are configured to:
 transmit a buffer occupancy report indicating the compressed size of the compressed data.

15. The UE of claim 13, wherein the one or more processors, to transmit the uplink transmission including the compressed data in the compressed size, are configured to:
 transmit a request for radio resources for the compressed data, wherein the request is based at least in part on the compressed size of the compressed data; and
 receive a radio resource grant based at least in part on the transmission of the request for radio resources for the compressed data.

16. The UE of claim 13, wherein the message indicates at least one of:
 a buffer occupancy value that is based at least in part on the uncompressed size of the data associated with the uplink transmission,
 an average of a buffer occupancy value that is based at least in part on the uncompressed size of the data associated with the uplink transmission, or
 a variance of a buffer occupancy value that is based at least in part on the uncompressed size of the data associated with the uplink transmission.

17. The UE of claim 13, wherein the one or more processors are further configured to:
 receive a radio bearer reconfiguration based at least in part on the transmission of the message; and
 transition to a different radio bearer configuration based at least in part on receiving the radio bearer reconfiguration.

18. The UE of claim 13, wherein the one or more processors are further configured to:
 receive a physical channel reconfiguration based at least in part on the transmission of the message; and
 transition to a different physical channel configuration based at least in part on receiving the physical channel reconfiguration.

19. The UE of claim 13, wherein the one or more processors are further configured to:
 receive a radio resource control state reconfiguration based at least in part on the transmission of the message; and
 transition to a different radio resource control state based at least in part on receiving the radio resource control state reconfiguration.

20. The UE of claim 19, wherein the one or more processors, to transmit the message, are configured to transmit a request for a change in a radio resource control state of the UE.

21. The UE of claim 13, wherein the message is a traffic volume measurement (TVM) report, a Layer 2 measurement report, or a buffer measurement report.

22. The UE of claim 13, wherein the message is at least one of a radio resource control (RRC) message, a packet data convergence protocol (PDCP) message, a radio link control (RLC) message, or a medium access control (MAC) message.

23. The UE of claim 13, wherein the message is at least one of a control protocol data unit (PDU) associated with a packet data convergence protocol (PDCP) layer, control PDU associated with a radio link control (RLC) layer, or a medium access control (MAC) control element.

24. The UE of claim 13, wherein the message indicates a request for a change in a bandwidth part (BWP) configuration, and wherein the one or more processors are further configured to:
 receive a bandwidth part (BWP) reconfiguration based at least in part on the transmission of the message; and
 transition to a different BWP configuration based at least in part on receiving the BWP reconfiguration.

25. A non-transitory computer-readable medium storing a set of instructions for wireless communication, the set of instructions comprising:
 one or more instructions that, when executed by one or more processors of a user equipment (UE), cause the UE to:
  compress data, of an uncompressed size, associated with an uplink transmission to a compressed size;
  receive a configuration indicating a threshold associated with the uncompressed size, wherein the configuration comprises a radio resource control configuration;
  transmit a message based at least in part on the uncompressed size of the data associated with the uplink transmission satisfying a threshold; and
  transmit the compressed data in the compressed size.

26. The non-transitory computer-readable medium of claim 25, wherein the one or more instructions, to transmit the uplink transmission including the compressed data in the compressed size, are further configured cause the UE to:
 transmit a buffer occupancy report indicating the compressed size of the compressed data.

27. The non-transitory computer-readable medium of claim 25, wherein the one or more instructions, to transmit the uplink transmission including the compressed data in the compressed size, are further configured to cause the UE to:
 transmit a request for radio resources for the compressed data, wherein the request is based at least in part on the compressed size of the compressed data; and
 receive a radio resource grant based at least in part on the transmission of the request for radio resources for the compressed data.

28. The non-transitory computer-readable medium of claim 25, wherein the message indicates at least one of:
 a buffer occupancy value that is based at least in part on the uncompressed size of the data associated with the uplink transmission,
 an average of a buffer occupancy value that is based at least in part on the uncompressed size of the data associated with the uplink transmission, or
 a variance of a buffer occupancy value that is based at least in part on the uncompressed size of the data associated with the uplink transmission.

29. The non-transitory computer-readable medium of claim 25, wherein the one or more instructions are further configured to cause the UE to:
 receive a radio bearer reconfiguration based at least in part on the transmission of the message; and
 transition to a different radio bearer configuration based at least in part on receiving the radio bearer reconfiguration.

30. An apparatus for wireless communication, comprising:
 means for compressing data, of an uncompressed size, associated with an uplink transmission to a compressed size;

means for receiving a configuration indicating a threshold associated with the uncompressed size, wherein the configuration comprises a radio resource control configuration;
means for transmitting a message based at least in part on the uncompressed size of the data associated with the uplink transmission satisfying a threshold; and
means for transmitting the compressed data in the compressed size.

* * * * *